(12) United States Patent
Bak et al.

(10) Patent No.: US 10,043,966 B2
(45) Date of Patent: Aug. 7, 2018

(54) SEMICONDUCTOR DEVICE INCLUDING VIA PLUGS

(71) Applicant: Samsung Electronics Co., Ltd., Suwon-si, Gyeonggi-do (KR)

(72) Inventors: Jung-hoon Bak, Suwon-si (KR); Kyung-tae Nam, Suwon-si (KR); Yong-jae Kim, Seoul (KR); Da-hye Shin, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/367,536

(22) Filed: Dec. 2, 2016

(65) Prior Publication Data

US 2017/0331031 A1 Nov. 16, 2017

(30) Foreign Application Priority Data

May 11, 2016 (KR) .................. 10-2016-0057817

(51) Int. Cl.
| | |
|---|---|
| *H01L 43/02* | (2006.01) |
| *H01L 27/22* | (2006.01) |
| *H01L 43/08* | (2006.01) |
| *H01L 43/10* | (2006.01) |
| *H01L 43/12* | (2006.01) |
| *H01L 21/768* | (2006.01) |

(Continued)

(52) U.S. Cl.
CPC ............ *H01L 43/02* (2013.01); *H01L 21/768* (2013.01); *H01L 21/823475* (2013.01); *H01L 21/823871* (2013.01); *H01L 23/522* (2013.01); *H01L 23/5226* (2013.01); *H01L 24/82* (2013.01); *H01L 27/228* (2013.01); *H01L 43/08* (2013.01); *H01L 43/10* (2013.01); *H01L 43/12* (2013.01)

(58) Field of Classification Search
CPC ......... H01L 43/02; H01L 43/12; H01L 43/10; H01L 43/08; H01L 27/228; H01L 21/768; H01L 21/823475; H01L 21/823871; H01L 23/522; H01L 23/5226; H01L 24/82
See application file for complete search history.

(56) References Cited

U.S. PATENT DOCUMENTS

| | | | |
|---|---|---|---|
| 7,432,556 B2 | 10/2008 | Eriguchi et al. | |
| 7,445,966 B2 | 11/2008 | Ellis-Monaghan et al. | |

(Continued)

FOREIGN PATENT DOCUMENTS

| | | |
|---|---|---|
| JP | 2006/344773 A | 12/2006 |
| KR | 10-0871354 B1 | 12/2008 |

*Primary Examiner* — Benjamin Sandvik
*Assistant Examiner* — Farid Khan
(74) *Attorney, Agent, or Firm* — Harness, Dickey & Pierce, P.L.C.

(57) ABSTRACT

A semiconductor device includes a lower insulating layer on a substrate, a lower wiring layer extending on the lower insulating layer, a lower surface of at least a part of the lower wiring layer being covered by the lower insulating layer, a plurality of via plugs extending in a first direction on the lower wiring layer, the plurality of via plugs including a real via plug and a first dummy via plug connected to the part of the lower wiring layer covered by the lower insulating layer, and an upper wiring layer overlapping the lower wiring layer and extending in a second direction different from the first direction on the real via plug, the upper wiring layer not overlapping the dummy via plug.

15 Claims, 25 Drawing Sheets

(51) Int. Cl.
*H01L 21/8234* (2006.01)
*H01L 21/8238* (2006.01)
*H01L 23/522* (2006.01)
*H01L 23/00* (2006.01)

(56) References Cited

U.S. PATENT DOCUMENTS

| | | | |
|---|---|---|---|
| 7,763,911 B2 * | 7/2010 | Zhang | H01L 27/0688 257/211 |
| 8,028,264 B2 | 9/2011 | Shimada et al. | |
| 8,138,563 B2 | 3/2012 | Cho et al. | |
| 8,853,762 B2 | 10/2014 | Tu et al. | |
| 9,070,687 B2 | 6/2015 | Lai et al. | |
| 2007/0013072 A1 * | 1/2007 | Ellis-Monaghan | H01L 27/0248 257/758 |
| 2007/0108614 A1 * | 5/2007 | Eriguchi | H01L 21/76838 257/741 |
| 2009/0187798 A1 * | 7/2009 | Kim | G11C 5/025 714/710 |
| 2009/0230562 A1 * | 9/2009 | Kondou | H01L 23/522 257/774 |
| 2009/0289369 A1 * | 11/2009 | Fang | H01L 21/76816 257/758 |
| 2013/0157384 A1 | 6/2013 | Park | |
| 2013/0157385 A1 | 6/2013 | Jung et al. | |
| 2014/0022836 A1 * | 1/2014 | Kim | G11C 29/10 365/158 |
| 2015/0179251 A1 * | 6/2015 | Yoshimoto | G11C 13/0023 365/148 |
| 2015/0249096 A1 * | 9/2015 | Lupino | H01L 27/11898 257/203 |
| 2016/0111360 A1 * | 4/2016 | Cho | H01L 21/784 257/774 |
| 2017/0005100 A1 * | 1/2017 | Cho | H01L 27/10897 |
| 2017/0330885 A1 * | 11/2017 | Yamamoto | H01L 27/1104 |

* cited by examiner

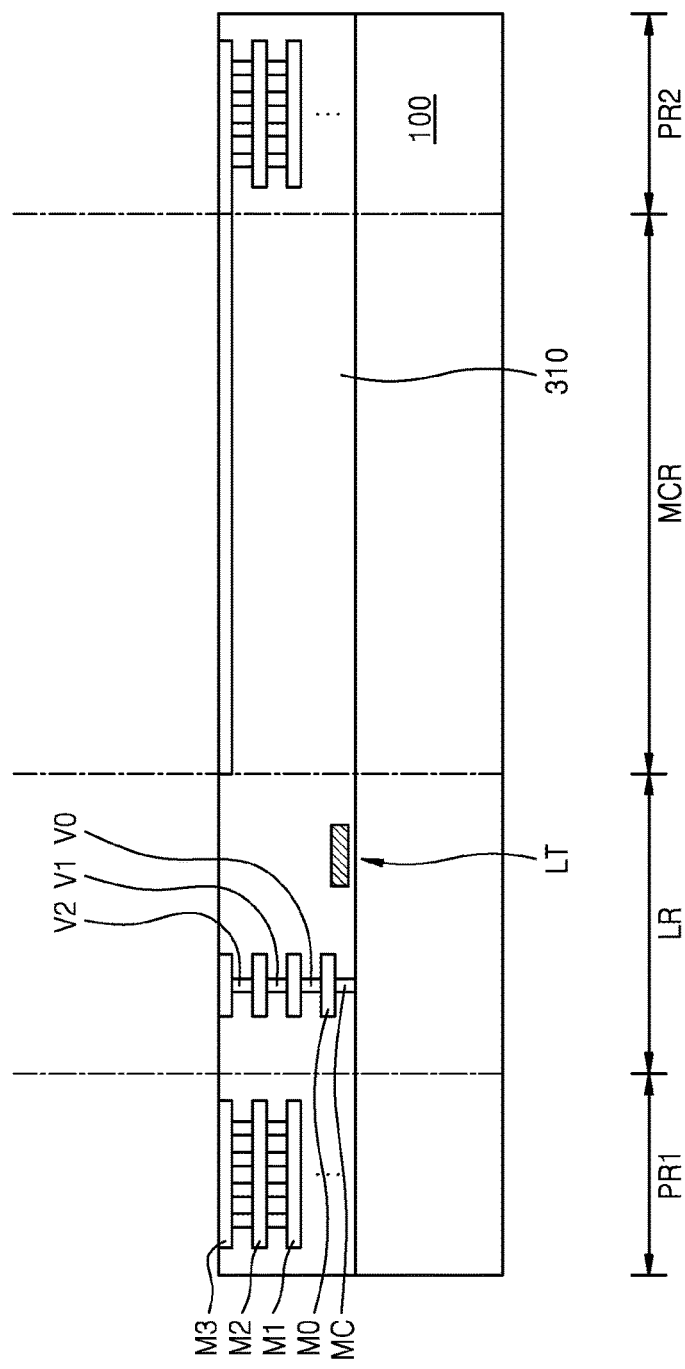

SEMICONDUCTOR DEVICE INCLUDING VIA PLUGS

CROSS-REFERENCE TO RELATED APPLICATION

This application claims the benefit of Korean Patent Application No. 10-2016-0057817, filed on May 11, 2016, in the Korean Intellectual Property Office, the disclosure of which is incorporated herein in its entirety by reference.

BACKGROUND

1. Field

Example embodiments of the inventive concepts relate to a semiconductor device including via plugs, and more particularly, to a semiconductor device including via plugs through which two wiring layers are electrically connected.

2. Description of the Related Art

As the electronic industry has rapidly developed and user demand for relatively small-sized and multifunctional electronic devices has increased, highly-integrated and multifunctional semiconductor devices are required. To this end, more wiring layers are formed in semiconductor devices and via plugs for electrically connecting wiring layers of different levels in the semiconductor devices having various layouts.

SUMMARY

Example embodiments of the inventive concepts provide a semiconductor device having a relatively high reliability and including via plugs through which two wiring layers are electrically connected.

According to example embodiments of the inventive concepts, a semiconductor device includes a substrate including a memory cell region and a pad region, a lower insulating layer on the substrate, a lower wiring layer extending on the lower insulating layer, a lower surface of the lower wiring layer being covered by the lower insulating layer in the memory cell region, a plurality of via plugs connected to and extending in a first direction on the lower wiring layer, the plurality of via plugs including a real via plug and a first dummy via plug, a plurality of memory cells on the lower wiring layer, each of the plurality of via plugs between each of the plurality of memory cells and the lower wiring layer, and the plurality of memory cells including a select memory cell connected to the real via plug and a first dummy memory cell connected to the first dummy via plug, an upper wiring layer connected to an upper surface of the real via plug and not connected to the first dummy memory cell, and an upper insulating layer covering the upper wiring layer and an upper surface of the first dummy memory cell.

According to example embodiments of the inventive concepts, a semiconductor device includes a lower insulating layer on a substrate, a lower wiring layer extending on the lower insulating layer, a lower surface of at least a part of the lower wiring layer being covered by the lower insulating layer, a plurality of via plugs extending in a first direction on the lower wiring layer, the plurality of via plugs including a real via plug and a first dummy via plug connected to the part of the lower wiring layer covered by the lower insulating layer, and an upper wiring layer overlapping the lower wiring layer and extending in a second direction different from the first direction on the real via plug, the upper wiring layer not overlapping the dummy via plug.

According to example embodiments of the inventive concepts, a semiconductor device includes a lower insulating layer on a substrate, a lower wiring layer extending on the lower insulating layer, a lower surface of a portion of the lower wiring layer being covered by the lower insulating layer, a plurality of via plugs extending in a first direction on the lower wiring layer, the plurality of via plugs including a plurality of real via plugs and a plurality of dummy via plugs connected to the part of the lower wiring layer covered by the lower insulating layer, a number of the plurality of dummy via plugs being greater than a number of the plurality of real via plugs, and an upper wiring layer overlapping the lower wiring layer.

BRIEF DESCRIPTION OF THE DRAWINGS

Example embodiments of the inventive concepts will be more clearly understood from the following detailed description taken in conjunction with the accompanying drawings in which:

FIG. 12A through 12F are cross-sectional views for sequentially describing a method of manufacturing a semiconductor device according to example embodiments;

DETAILED DESCRIPTION

Figure 1:
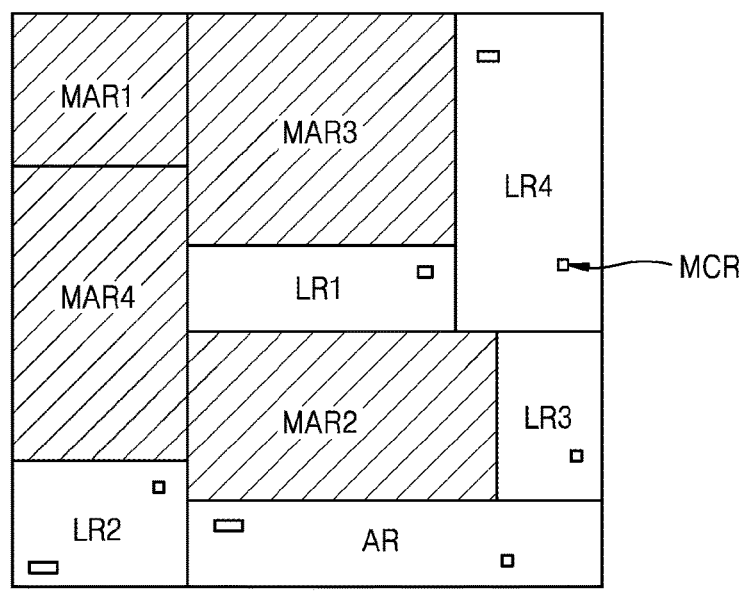
FIG. 1 is a view of a schematic configuration of a semiconductor device according to example embodiments.

FIG. 1 is a view of a schematic configuration of a semiconductor device 10 according to example embodiments.

Referring to FIG. 1, the semiconductor device 10 may include a plurality of logic regions LR1~LR4. A main processing unit (MPU), a graphic processing unit (GPU), an interface, or an intellectual property (IP) such as a functional block, etc. may be arranged in each of the plurality of logic regions LR1~LR4.

In example embodiments, the semiconductor device 10 may further include a plurality of memory array regions MAR1~MAR4. A memory cell array, for example, of a high capacity from several hundred Mbyte to several Gbyte may be formed in the memory array regions MAR1~MAR4. The semiconductor device 10 may be an embedded semiconductor device in which a memory device and a logic device are integrated into one chip. A heterogeneous memory device or a homogeneous memory device may be formed in each of the memory array regions MAR1~MAR4.

For example, a volatile memory device may be formed in each of the first and second memory array regions MAR1 and MAR2, a non-volatile memory device may be formed in the third memory array region MAR3, and a read only memory (ROM) device may be formed in the fourth memory array region MAR4.

The volatile memory device may be, for example, static random access memory (STRAM) and/or dynamic RAM (DRAM). The volatile memory device may include, for example, magneto-resistive RAM (MRAM), phase-change (PRAM), resistive RAM (RRAM) and/or flash memory. The ROM may include, for example, programmable (PRROM) or electrically erasable programmable ROM (EEPROM).

Conventional semiconductor device may include SRAM as the volatile memory device and flash memory as the non-volatile memory device. That is, SRAM may be formed in some of the plurality of memory array regions, and flash memory may be formed in other of them in conventional semiconductor device.

In example embodiments, non-volatile memory devices may be formed in all of the first through fourth memory array regions MAR1~MAR4. The non-volatile memory device may be, for example, MRAM, PRAM, or RRAM.

For reference, the non-volatile memory device, such as MRAM, PRAM, or RRAM, is a resistance-based memory device which may maintain stored information even when powered off. The non-volatile memory device is generally slower than the volatile memory device, whereas the non-volatile memory device may have read and write response time comparable to read and write response time of the volatile memory device such as MRAM, PRAM, or RRAM. For example, MRAM, PRAM, or RRAM may be an all-round memory device having the low cost and high capacity characteristics of DRAM, the high speed operation characteristic of SRAM, and the non-volatile characteristic of flash memory.

In the semiconductor device 10 according to example embodiments, a non-volatile memory device as presented above may be formed in at least one of the first through fourth memory array regions MAR1~MAR4. For example, MRAM, PRAM, or RRAM may be formed in a portion of the embedded semiconductor device in which flash memory is formed. Alternatively, in the semiconductor device 10 according to example embodiments, MRAM, PRAM, or RRAM may be formed in all the first through fourth memory array regions MAR1~MAR4. In example embodiments, MRAM, PRAM, or RRAM formed in the first and second memory array regions MAR1 and MAR2 may be replaced with SRAM, MRAM, or PRAM, RRAM formed in the third memory array region MAR3 may be replaced with flash memory, and MRAM, PRAM, or RRAM formed in the fourth memory array region MAR4 may be replaced with ROM. In this case, for compatibility with the IP disposed in a logic region in the semiconductor device 10, MRAM, PRAM, or RRAM having different device characteristics may be formed in the first through fourth memory array regions MAR1~MAR4.

In example embodiments, the semiconductor device 10 may further include an analog region AR in which an analog device is formed.

At least some of the logic regions LR1~LR4 of the semiconductor device 10 may include a memory cell region MCR. A memory cell of a relatively small capacity from several bits to several Kbytes may be formed in the memory cell region MCR compared to the memory array regions MAR1~MAR4. The memory cell region MCR may be a portion in which a memory cell for a registry, a buffer, etc. required in the logic regions LR1~LR4 is formed. In example embodiments, a non-volatile memory device may be formed in the memory cell region MCR. The non-volatile memory device may be a resistor-based memory device such as MRAM, PRAM, or RRAM.

According to FIG. 1, the semiconductor device 10 includes the plurality of logic regions LR1~LR4 and/or the plurality of memory array regions MAR1~MAR4, but the present inventive concepts are not limited thereto. In example embodiments, the semiconductor device 10 may include one logic region and/or one memory array region.

Figure 2A:
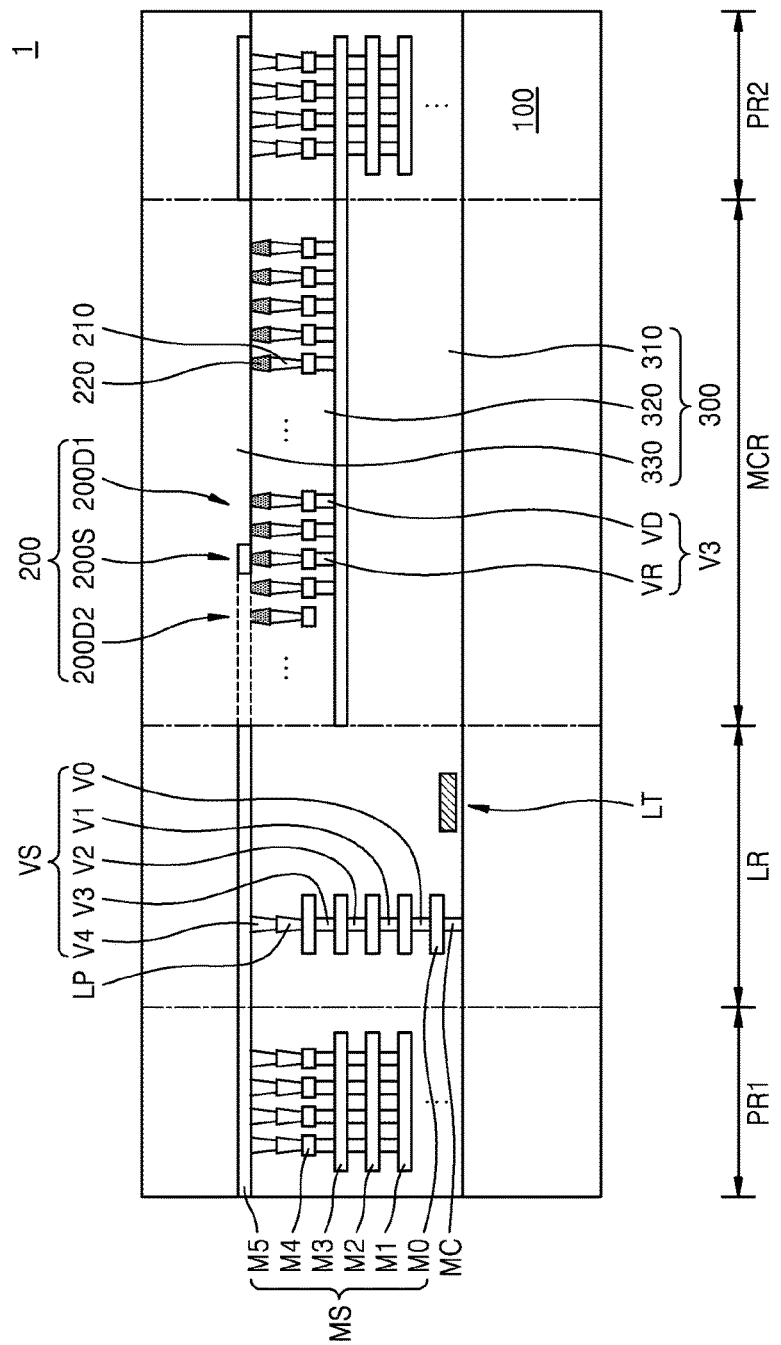
FIG. 2A is a cross-sectional view of a main part of a semiconductor device according to example embodiments.

FIG. 2A is a cross-sectional view of a main part of a semiconductor device 1 according to example embodiments.

Referring to FIG. 2A, the semiconductor device 1 may include a logic region LR and the memory cell region MCR. The memory cell region MCR is illustrated as a separate region from the logic region LR but is not limited thereto. The memory cell region MCR may be a portion of the logic region LR in which a memory cell is formed. The semiconductor device 1 may further include pad regions PR1 and PR2. The pad regions PR1 and PR2 may include a first pad region PR1 and a second pad region PR2. The first pad region PR1 and the second pad region PR2 may be portions that are respectively connected to both ends of the memory cell formed in the memory cell region MCR and provide an electrical connection to an external pad. The pad regions PR1 and PR2 are illustrated as separate regions from the logic region LR and the memory cell region MCR but are not limited thereto. The pad regions PR1 and PR2 may be portions of the logic region LR that provide the electrical connection to the external pad.

The semiconductor device 1 may include an insulating layer 300 formed on a substrate 100 and a wiring structure MS and a via structure VS that are formed in the insulating layer 300.

The substrate 100 may include at least one of a group III-V material and a group IV material. The substrate 100 may include, for example, a semiconductor such as silicon (Si) or germanium (Ge) or a compound semiconductor such silicon germanium (SiGe), silicon carbide (SiC), gallium arsenide (GaAs), indium arsenide (InAs), and indium phosphide (InP). The group III-V material may include a binary, a trinary, or a quarternary compound including at least one group III element and at least one group V element. The group III-V material may be a compound including at least one element of In, Ga, and Al as the group III element and at least one element of As, P, and Sb as the group V element. For example, the group III-V material may be selected from InP, $In_zGa_{1-z}As$ ($0 \leq z \leq 1$), and $Al_zGa_{1-z}As$ ($0 \leq z \leq 1$). The binary compound may be one of, for example, InP, GaAs, InAs, InSb and GaSb. The trinary compound may be one of InGaP, InGaAs, AlInAs, InGaSb, GaAsSb and GaAsP. The group IV material may be Si or Ge. However, example embodiments of the inventive concepts are not limited to the above examples of the Group III-V material and the Group IV material. In example embodiments, the substrate 100 may have a silicon-on-insulator (SOI) structure. In example embodiments, the substrate 100 may include a buried oxide (BOX) layer. The substrate 100 may include a conductive region, for example, a well doped with impurities or a structure doped with impurities. The substrate 100 may also have various device isolation structures such as a shallow trench isolation (STI) structure and a deep trench isolation (DTI) structure.

The insulating layer 300 may be formed by sequentially stacking a plurality of insulating layers. The insulating layer 300 may include a lower insulating layer 310, an intermediate insulating layer 320, and an upper insulating layer 330. The lower insulating layer 310, the intermediate insulating layer 320, and the upper insulating layer 330 may be insulating layers that are separately stacked and formed but are not limited thereto. According to an embodiment, the lower insulating layer 310, the intermediate insulating layer 320, and the upper insulating layer 330 may be separate components from the insulating layer 300 formed on the substrate 100 of the semiconductor device 1 and may not be separately stacked and formed.

For example, each of the lower insulating layer 310, the intermediate insulating layer 320, and the upper insulating layer 330 may be one insulating layer or be formed by staking a plurality of insulating layers on each other, may be an insulating layer including a part of the lower insulating layer 310 and a part of the intermediate insulating layer 320, or may be an insulating layer including a part of the intermediate insulating layer 320 and a part of the upper insulating layer 330.

In example embodiments, at least a part of a boundary surface adjacent to each of a plurality of insulating layers constituting the insulating layer 300 may be at the same level as an upper surface and/or a lower surface of each of wiring layers M0, M1, M2, M3, M4, and M5 constituting the wiring structure MS or each of via plugs V0, V1, V2, V3, and V4 constituting the via structure VS. The boundary surface adjacent to each of the plurality of insulating layers constituting the insulating layer 300 may be positioned at a different level according to a method of forming the wiring layers M0, M1, M2, M3, M4, and M5 constituting the wiring structure MS and/or the via plugs V0, V1, V2, V3, and V4 constituting the via structure VS.

For example, when a part of the wiring structure MS is formed through a patterning process, the boundary surface between adjacent insulating layers constituting the insulating layer 300 may be at the same level as a lower surface of the wiring structure MS formed through the patterning process. Alternatively, when the part of the wiring structure MS is formed through a damascene process, the boundary surface between adjacent insulating layers constituting the insulating layer 300 may be at the same level as an upper surface of the wiring structure MS formed through the damascene process.

As described above, it is obvious to one of ordinary skill in the art that the plurality of insulating layers constituting the insulating layer 300 may be configured in various ways according to a method of forming the wiring structure MS and the via structure VS, and thus, a detailed description thereof is omitted.

Each of the plurality of insulating layers constituting the insulating layer 300 may include a low dielectric layer having a lower dielectric constant than that of an oxide layer or a silicon oxide layer. The low dielectric layer may be, for example, an SiOC layer or an SiCOH layer. In example embodiments, each of the plurality of insulating layers may include a base insulating layer including the oxide layer or the low dielectric layer and a capping insulating layer covering the base insulating layer. The capping insulating layer may be used as a diffusion prevention layer for the wiring layers M0, M1, M2, M3, M4, and M5. The capping insulating layer may be, for example, an SiC layer or an SIN layer.

The wiring structure MS and the via structure VS may be formed in the insulating layer 300. The wiring structure MS may include the plurality of wiring layers M0, M1, M2, M3, M4, and M5. For example, the plurality of wiring layers M0, M1, M2, M3, M4, and M5 may include $0^{th}$ through fifth wiring layers M0, M1, M2, M3, M4, and M5. The via structure VS may include the plurality of via plugs V0, V1, V2, V3, and V4 that connect the plurality of wiring layers M0, M1, M2, M3, M4, and M5. For example, the plurality of via plugs V0, V1, V2, V3, and V4 may include $0^{th}$ through fourth via plugs V0, V1, V2, V3, and V4. A barrier layer and/or a seed layer may be formed in side surfaces and a lower surface of each of the plurality of wiring layers M0, M1, M2, M3, M4, and M5 and/or the plurality of via plugs V0, V1, V2, V3, and V4.

At least some of the plurality of wiring layers M0, M1, M2, M3, M4, and M5 and at least some of the plurality of via plugs V0, V1, V2, V3, and V4 may be integrally formed by a conductive material including metal. For example, at least some of the plurality of wiring layers M0, M1, M2, M3, M4, and M5 and at least some of the plurality of via plugs V0, V1, V2, V3, and V4 may be integrally formed by copper or a conductive material including copper. The barrier layer may include, for example, Ta, Ti, TaN, TiN, or a combination of these. The seed layer may include, for example, the same metal atom as that of or the same material as a material forming the plurality of wiring layers M0, M1, M2, M3, M4, and M5 and/or the plurality of via plugs V0, V1, V2, V3, and V4. For example, the seed layer may include copper or the conductive material including copper.

The semiconductor device 1 may include a logic device LT formed in the logic region LR and a memory cell 200 formed in the memory cell region MCR. The logic device LT may be configured by a diode, a transistor, etc. in various ways. The memory cell 200 may include a lower electrode 210 and a resistance device 220 disposed on the lower electrode 210. The resistance device 220 may be a magnetoresistance device having a magnetic tunnel junction (MTJ) structure, a variable resistance device, or a phase change device. In example embodiments, the memory cell 200 may further include an upper electrode disposed on the resistance device 220.

A plurality of memory cells 200 may be disposed on one wiring layer among the plurality of wiring layers M0, M1, M2, M3, M4, and M5, i.e. the third wiring layer M3, along the one wiring layer in the memory cell region MCR. Although the plurality of memory cells 200 are disposed on the third wiring layer M3 among the plurality of wiring layers M0, M1, M2, M3, M4, and M5 constituting the wiring structure MS in FIG. 2A, this is an example. The plurality of memory cells 200 may be disposed on one wiring layer among the $0^{th}$ through fifth wiring layers M0, M1, M2, M3, M4, and M5.

A plurality of third via plugs V3 connected to the third wiring layer M3 may be arranged on the third layer M3 in an extension direction of the third wiring layer M3. The plurality of third via plugs V3 may be disposed on a portion of a lower surface of the third wiring layer M3 surrounded by the lower insulating layer 310 along the extension direction of the third wiring layer M3. A plurality of fourth wiring layers M4 may be formed on the plurality of third via plugs V3. At least some of the plurality of fourth wiring layers M4 may be connected to each of the plurality of third via plugs V3. Some of the plurality of fourth wiring layers M4 may not be connected to the third via plug V3. That is, the intermediate insulating layer 320 may cover lower surfaces of some of the plurality of fourth wiring layers M4.

The plurality of memory cells 200 may be respectively formed on the plurality of fourth wiring layers M4. The lower electrode 210 included in each of the plurality of memory cells 200 may be connected to each of the plurality of fourth wiring layers M4.

The fifth wiring layer M5 connected to some of the plurality of memory cells 200 may be formed on the plurality of memory cells 200. The plurality of memory cells 200 may include a select memory cell 200S connected to the fifth wiring layer M5 and dummy memory cells 200D1 and 200D2 that are not connected to the fifth wiring layer M5. The dummy memory cells 200D1 and 200D2 may include a first dummy memory cell 200D1 connected to the third wiring layer M3 through the third via plug V3 and a second dummy memory cell 200D2 that is not connected to the third wiring layer M3. In example embodiments, the second dummy memory cell 200D2 may not be formed.

Both ends of the select memory cell 200S may be connected to the third wiring layer M3 and the fifth wiring layer M5, whereas one end of the dummy memory cells 200D1 and 200D2, i.e. upper ends, may not be connected to the fifth wiring layer M5. Thus, the select memory cell 200S may operate as a memory cell capable of writing and reading data though the third wiring layer M3 and the fifth wiring layer M5, whereas the dummy memory cells 200D1 and 200D2 may be unable to write and read data since upper ends thereof are covered by the upper insulating layer 330.

The fifth wiring layer M5 and the third wiring layer M3 that are connected to the select memory cell 200S may respectively extend to the first pad region PR1 and the second pad region PR2 or may be electrically connected to the wiring structure MS formed in the first pad region PR1 and the second pad region PR2 so that data may be written and read by an operating signal provided from an external pad. Alternatively, the fifth wiring layer M5 and the third wiring layer M3 that are connected to the select memory cell 200S may extend to the logic region LR or may be electrically connected to the wiring structure MS formed in the logic region LR.

Although a lower end of the first dummy memory cell 200D1 may be connected to the third wiring layer M3 through the fourth wiring layer M4 and the third via plug V3 and a lower end of the second dummy memory cell 200D2 may be connected to the fourth wiring layer M4, since the fourth wiring layer M4 connected to the lower end of the second dummy memory cell 200D2 is covered by the intermediate insulating layer 320, the second dummy memory cell 200D2 may not be connected to both the third wiring layer M3 and the fifth wiring layer M5.

The third via plug V3 formed in the memory cell region MCR may include a real via plug VR connected to the select memory cell 200S and a dummy via plug VD connected to the dummy memory cells 200D1 and 200D2, in particular, the first dummy memory cell 200D1. The number of the dummy via plugs VD may be greater than that of the real via plugs VR. For example, the number of the dummy via plugs VD may be several times to several hundred times greater than that of the real via plugs VR.

The third wiring layer M3 formed in the memory cell region MCR may be insulated from the substrate 100 in the memory cell region MCR. That is, a lower surface and/or side surfaces of the third wiring layer M3 formed in the memory cell region MCR may be surrounded by the lower insulating layer 310 so that the third wiring layer M3 is not electrically connected to the substrate 100 in the memory cell region MCR.

In general, to form the third via plug V3, an etching process of forming a via hole in a part of the insulating layer 300 may be formed and then a process of filling a conductive material in the via hole may be performed.

When dry etching is performed to form the via hole, charges may be transferred to a portion of the third wiring layer M3 adjacent to the via hole by ions, etc. used in dry etching. Charges may be transferred to the substrate 100 through a relatively short path from a portion of the third wiring layer M3 adjacent to the via hole in the logic region LR and the pad regions PR1 and PR2. However, the lower surface and/or the side surfaces of the third wiring layer M3 formed in the memory cell region MCR may be surrounded by the lower insulating layer 310, and thus charges need to be transferred to the substrate 100 through a relatively long path from through the logic region LR and/or the pad regions PR1 and PR2. That is, charges transferred to the third wiring layer M3 in the logic region LR and the pad regions PR1 and PR2 may be transferred to the substrate 100 in a short time, whereas charges transferred to the third wiring layer M3 in the memory cell region MCR may be transferred to the substrate 100 in a relatively long time.

Thus, a charging effect that charges increase may occur in the third wiring layer M3 of the memory cell region MCR during dry etching for forming the via hole.

In particular, when only the real via plug VR, which is connected to the select memory cell 200S and is actually used, from among the third via plugs V3 is formed in the memory cell region MCR, a charging effect may excessively occur. In this case, since an etchant including ions, etc. used in dry etching for forming the via hole may not reach the insulating layer 300, a not-opening defect, that is, the via hole is not normally formed, may occur. Accordingly, the third via plug V3 is electrically disconnected from the third wiring layer M3.

However, the semiconductor device 1 according to example embodiments may include the real via plug VR and the dummy via plug VD, thereby reducing or minimizing the charging effect, and thus the not-open defect may be reduced or prevented. More specifically, charges that may concentrate on a portion of the third wiring layer M3 adjacent to the real via plug VR may be distributed in portions of the third wiring layer M3 adjacent to the dummy via plug VD, thereby reducing or preventing the not-open defect.

Therefore, more via holes for forming the dummy via plug VD may be formed than the via holes for forming the real via plug VR. Thus, the number of the dummy via plugs VD may be greater than that of real via plugs VR. For example, the number of the dummy via plugs VD may be several times to several hundred times greater than that of real via plugs VR.

In example embodiments, the third via plug V3 and the fourth wiring layer M4 that are connected to each other may be formed through a dual damascene process and may be integrally formed. Thus, the number of the fourth wiring layers M4 respectively corresponding to the plurality of memory cells 200 may be the same as or greater than the number of the third via plugs V3. The number of the memory cells 200 including the select memory cell 200S and the dummy memory cells 200D1 and 200D2 that are formed on the fourth wiring layer M4 may be the same as or greater than the number of the real via plugs VR and the dummy via plugs VD.

A contact plug MC connecting the wiring structure MS and the via structure VS to the logic device LT may be formed in the logic region LR. According to FIG. 2, the contact plug MC is connected to the substrate 100, but the present inventive concepts are not limited thereto. According to example embodiments, the contact plug MC may be connected to a potion corresponding to a terminal of the logic device LT. For example, when the logic device LT is a transistor, the contact plug MC may be connected to a gate, a source, and/or a drain of the logic gate LT. According to FIG. 2A, the contact plug MC is formed only in the logic region LR, however the present inventive concepts are not limited thereto. When the contact plug MC is necessary for configuring a circuit, the contact plug MC may be formed in a different region of the semiconductor device 1.

The wiring structure MS and the via structure VS may be formed in the pad regions PR1 and PR2. Since the wiring structure MS and the via structure VS that are formed in the pad regions PR1 and PR2 are electrically connected to an external pad, the wiring structure MS and the via structure VS may need to have a relatively large unit area so that a relatively strong current can pass therethrough. In this regard, in the wiring structure MS and the via structure VS formed in the pad regions PR1 and PR2, a plurality of third via plugs V3 and a plurality of fourth wiring layers M4 that correspond to the wiring layer M4 formed on the dummy via plug VD and the dummy via plug VD of the memory cell region MCR may be formed in and may be commonly coupled to one another. That is, the plurality of third via plugs V3 and the plurality of fourth wiring layers M4 may be commonly coupled in the pad regions PR1 and PR2, thereby electrically connecting the third wiring layer M3 to the fifth wiring layer M5.

A horizontal unit area of the plurality of third via plugs V3 in the pad regions PR1 and PR2 may be substantially the same as a horizontal unit area of the third via plug V3 in the memory cell region MCR, i.e., the real via plug VR and the dummy via plug VD, thereby easily forming the third via plug V3 throughout all regions of the semiconductor device 1.

In example embodiments, a horizontal unit area of the plurality of fourth wiring layers M4 in the pad regions PR1 and PR2 may be substantially the same as a horizontal unit area of the fourth wiring layer M4 in the memory cell region MCR.

The fourth via plug V4 and a landing plug LP may be formed between the fourth wiring layer M4 and the fifth wiring layer M5 in the logic region LR and/or the pad regions PR1 and PR2, and thus the fourth wiring layer M4 and the fifth wiring layer M5 may be electrically connected to each other through the fourth via plug V4 and the landing plug LP. In example embodiments, the landing plug LP may not be formed. When a space between the fourth wiring layer M4 and the fifth wiring layer M5 relatively increases in order to form the memory cell 200, the landing plug LP may be selectively formed in order to enhance reliability in an electrical connection between the fourth wiring layer M4 and the fifth wiring layer M5.

Figure 2B:
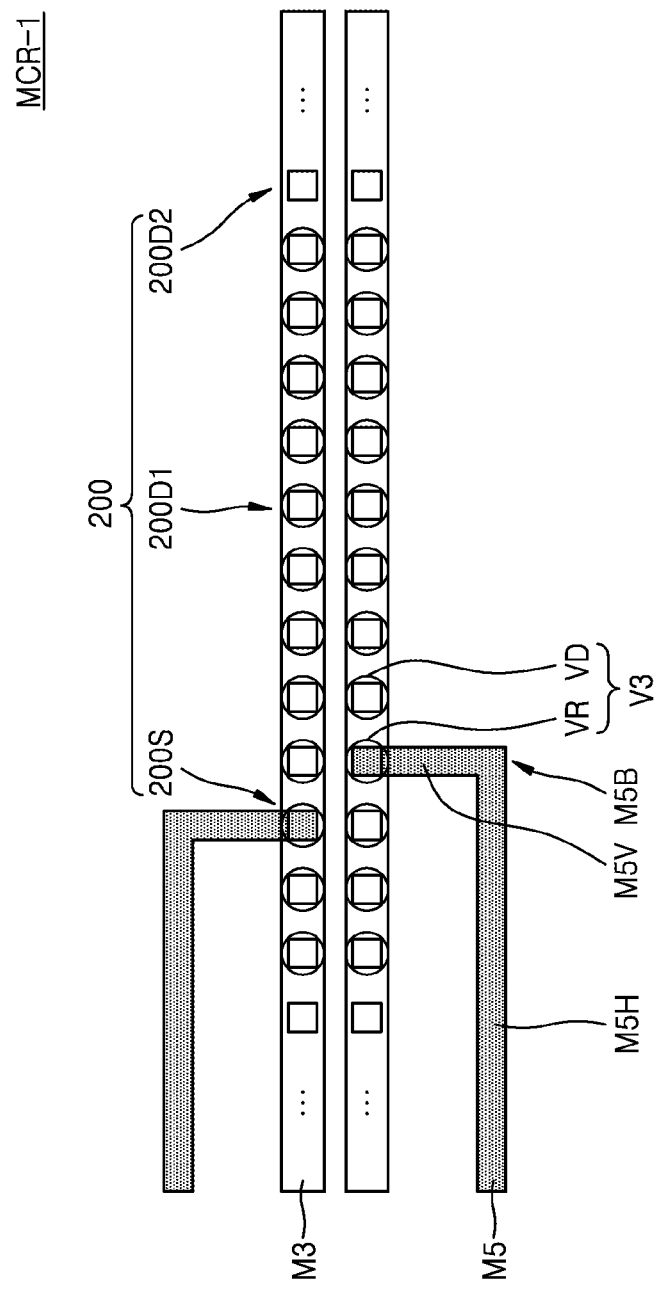
FIG. 2B is a schematic plan layout of a memory cell region of a semiconductor device according to example embodiments.

FIG. 2B is a schematic plan layout of a memory cell region MCR-1 of a semiconductor device according to example embodiments. FIG. 2B is a schematic plan layout of an embodiment of a main part of the memory cell region MCR of FIG. 2A.

Referring to FIG. 2B, the third wiring layer M3, and the plurality of third via plugs V3 which are connected to the third wiring layer M3 and disposed on the third wiring layer M3 may be formed in the memory cell region MCR-1. The plurality of third via plugs V3 may be formed on the third wiring layer M3. The plurality of memory cells 200 may be formed on the third wiring layer M3. The plurality of via plugs V3 may be disposed between the third wiring layer M3 and at least some of the plurality of memory cells 200. The plurality of memory cells 200 may include the select memory cell 200S and the dummy memory cells 200D1 and 200D2. The fifth wiring layer M5 connected to the select memory cell 200S may be formed on the select memory cell 200S. The fifth wiring layer M5 may be connected to the select memory cell 200S and may not be connected to the dummy memory cells 200D1 and 200D2. The fifth wiring layer M5 may include a first portion M5V extending in a different direction from an extension direction of the third wiring layer M3 and a second portion M5H extending in a different direction from an extension direction of the first portion M5V on the select memory cell 200S. Thus, the fifth wiring layer M5 may have a bending portion M5B between the first portion M5V and the second portion M5H. In example embodiments, an extension direction of the second portion M5H may be the same as the extension direction of the third wiring layer M3. Accordingly, the one fifth wiring layer M5 may overlap with the one third wiring layer M3 with the select memory cell 200S and the real via plug VR disposed between the one fifth wiring layer M5 and the one third wiring layer M3 in the memory cell region MCR-1, and the fifth wiring layer M5 may not overlap with the dummy memory cell 200D and the dummy via plug VD that are formed on the overlapped one third wiring layer M3.

The dummy memory cells 200D1 and 200D2 may include the first dummy memory cell 200D1 that is disposed on the third via plug V3 and is connected to the third via plug V3 and the second dummy memory cell 200D2 that is disposed in a portion in which the third via plug V3 is not formed and is not connected to the third via plug V3. In example embodiments, the second dummy memory cell 200D2 may not be formed.

Since the resistance device 220 of FIG. 2A of the memory cell 200 basically includes an insulating material, although the fifth wiring layer M5 is connected to only the select memory cell 200S among the memory cells 200, a charging effect may not concentrate on a portion of the select memory cell 200S during an etching process for forming the fifth wiring layer M5. Thus, a dummy wiring layer for reducing or minimizing the charging effect may not be formed during a process of forming the fifth wiring layer M5.

Both the dummy via plug VD included in the third via plug V3 and the dummy memory cells 200D1 and 200D2 are illustrated to overlap with the third wiring layer M3 in FIG. 2 but are not limited thereto. When a not-open defect occurs due to the charging effect during a process of forming a dummy via plug and/or a dummy memory cell that do not overlap with the third wiring layer M3, since the dummy via plug and/or the dummy memory cell do not affect an operation of the semiconductor device 1 of FIG. 2A, in example embodiments, the dummy via plug and the dummy memory cell that do not overlap with the third wiring layer M3 may be further formed in the memory cell region MCR-1.

Figure 2C:
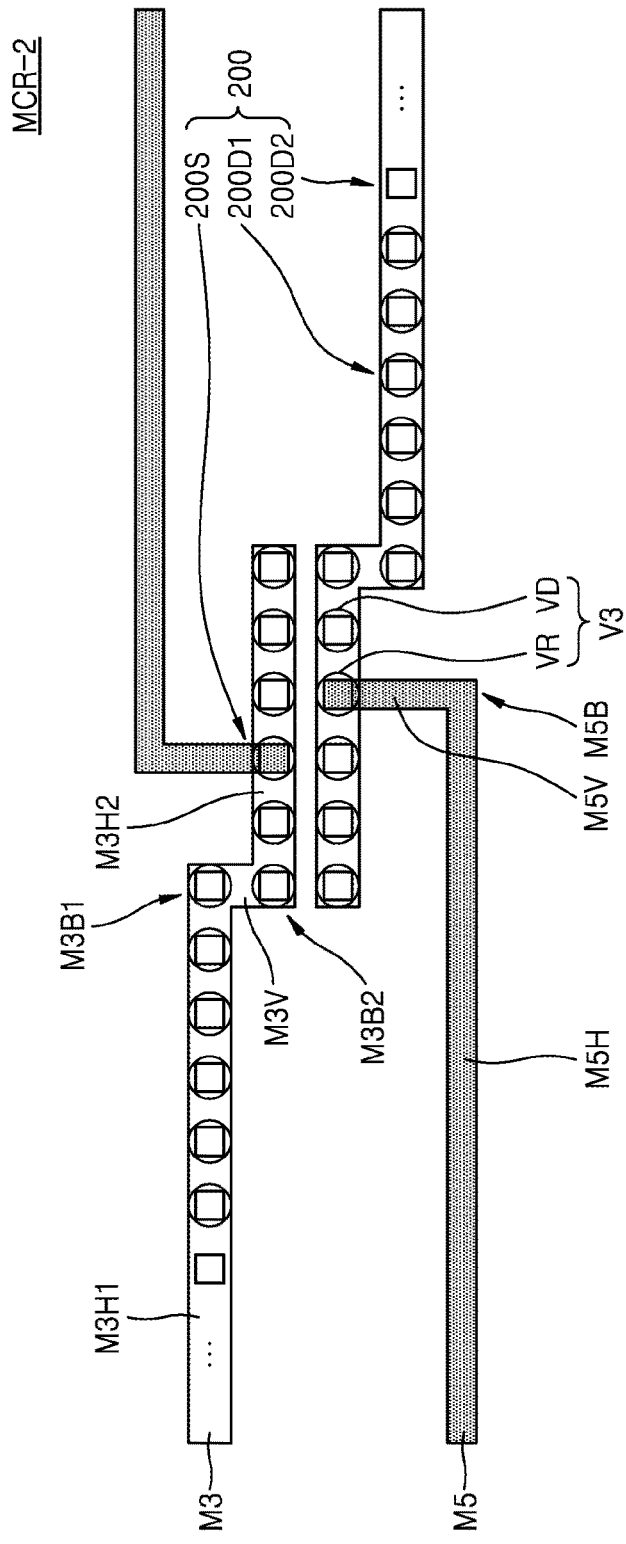
FIG. 2C is a schematic plan layout of a memory cell region of a semiconductor device according to example embodiments.

FIG. 2C is a schematic plan layout of a memory cell region MCR-2 of a semiconductor device according to example embodiments. FIG. 2C is a schematic plan layout of an embodiment of a main part of the memory cell region MCR of FIG. 2A. Redundant descriptions with respect to FIGS. 2C and 2B are omitted.

Referring to FIG. 2C, the third wiring layer M3, and the plurality of third via plugs V3 which are connected to the third wiring layer M3 and disposed on the third wiring layer M3 may be formed in the memory cell region MCR-2. The plurality of third via plugs V3 may be formed on the third wiring layer M3. The plurality of memory cells 200 may be formed on the third wiring layer M3. The plurality of via plugs V3 may be formed between the third wiring layer M3 and at least some of the plurality of memory cells 200. The plurality of memory cells 200 may include the select memory cell 200S and the dummy memory cells 200D1 and 200D2. The fifth wiring layer M5 connected to the select memory cell 200S may be formed on the select memory cell 200S. The fifth wiring layer M5 may be connected to the select memory cell 200S and may not be connected to the dummy memory cells 200D1 and 200D2.

The fifth wiring layer M5 may include the first portion M5V extending in a different direction from an extension direction of the third wiring layer M3 in which the select memory cell 200S is disposed and the second portion M5H extending in a different direction from an extension direction of the first portion M5V on the select memory cell 200S. Thus, the fifth wiring layer M5 may have the bending portion M5B between the first portion M5V and the second portion M5H. Accordingly, the one fifth wiring layer M5 may overlap with the one third wiring layer M3 with the one select memory cell 200S disposed between the one fifth wiring layer M5 and the one third wiring layer M3 in the memory cell region MCR-2.

The third wiring layer M3 may include one or more bending portions M3B1 and M3B2. The third wiring layer M3 may include first through third M3H1, M3V, and M3H2 respectively in relation to the bending portions M3B1 and M3B2. In example embodiments, when the two adjacent third wiring layers M3 are formed, the select memory cell 200S may be arranged on the third portion M3H2 that is relatively most adjacent to each of the two adjacent third wiring layers M3.

Figure 3A:
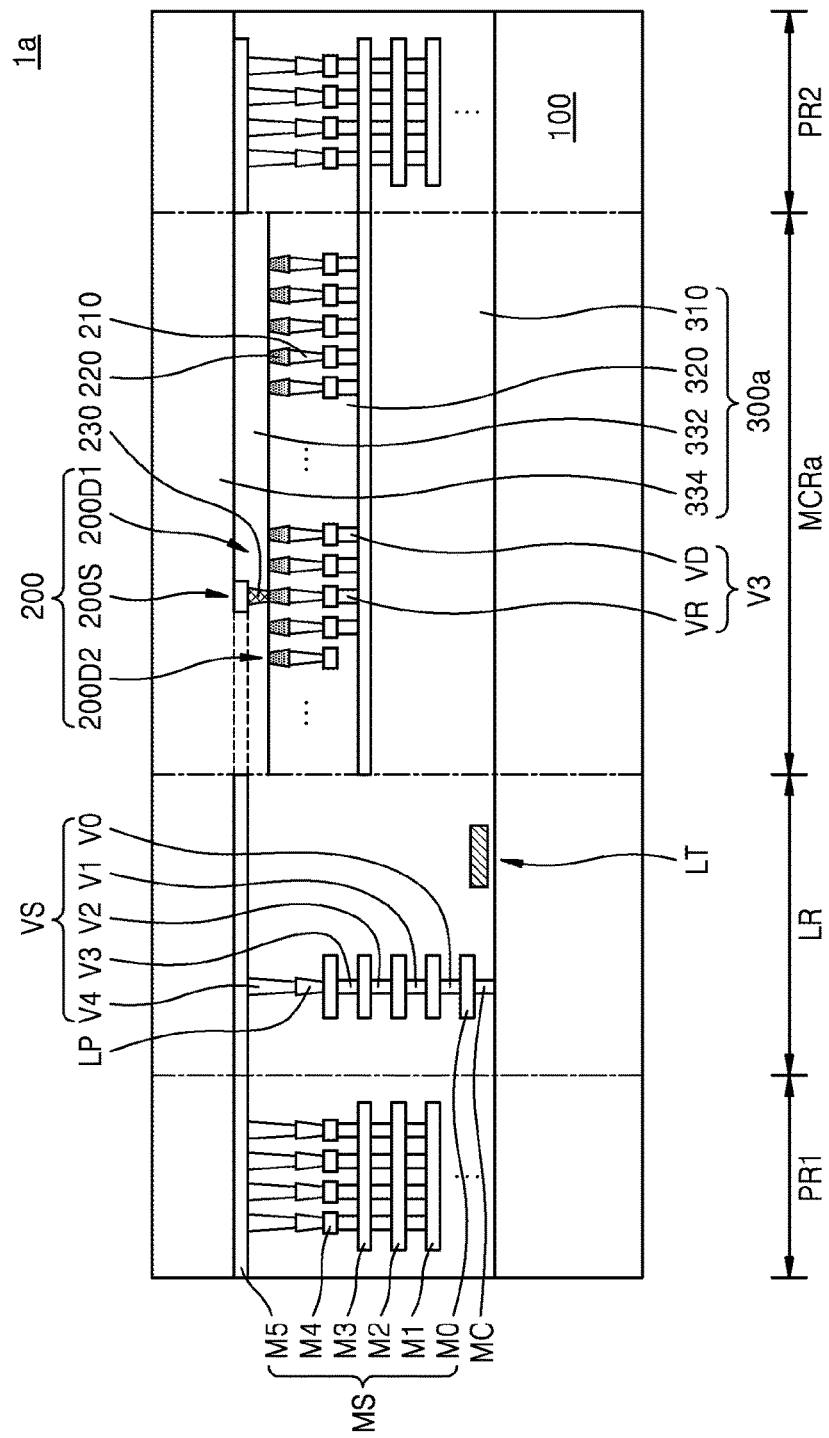
FIG. 3A is a cross-sectional view of a main part of a semiconductor device according to example embodiments.

FIG. 3A is a cross-sectional view of a main part of a semiconductor device 1a according to example embodiments. Redundant descriptions with respect to FIGS. 3A and 2A are omitted.

Referring to FIG. 3A, the semiconductor device 1a may include the logic region LR and a memory cell region MCRa. The memory cell region MCRa is illustrated as a separate region from the logic region LR but is not limited thereto. The memory cell region MCRa may be a portion of the logic region LR in which a memory cell is formed. The semiconductor device 1a may further include the pad regions PR1 and PR2. The pad regions PR1 and PR2 may include the first pad region PR1 and the second pad region PR2. The first pad region PR1 and the second pad region PR2 may be portions that are respectively connected to both ends of the memory cell formed in the memory cell region MCRs and provide an electrical connection to an external pad. The pad regions PR1 and PR2 are illustrated as separate regions from the logic region LR and the memory cell region MCRa but are not limited thereto. The pad regions PR1 and PR2 may be portions of the logic region LR that provide the electrical connection to the external pad.

The semiconductor device 1a may include an insulating layer 300a formed on the substrate 100 and the wiring structure MS and the via structure VS that are formed in the insulating layer 300a.

The insulating layer 300a may be formed by sequentially stacking a plurality of insulating layer. The insulating layer 300a may include the lower insulating layer 310, the intermediate insulating layer 320, a first upper insulating layer 332, and a second upper insulating layer 334. The lower insulating layer 310, the intermediate insulating layer 320, the first upper insulating layer 332, and the second upper insulating layer 334 may be insulating layers that are separately stacked and formed but are not limited thereto.

The wiring structure MS and the via structure VS may be formed in the insulating layer 300a. The wiring structure MS may include the plurality of wiring layers M0, M1, M2, M3, M4, and M5. For example, the plurality of wiring layers M0, M1, M2, M3, M4, and M5 may include the $0^{th}$ through fifth wiring layers M0, M1, M2, M3, M4, and M5. The via structure VS may include the plurality of via plugs V0, V1, V2, V3, and V4 that connect the plurality of wiring layers M0, M1, M2, M3, M4, and M5. For example, the plurality of via plugs V0, V1, V2, V3, and V4 may include the $0^{th}$ through fourth via plugs V0, V1, V2, V3, and V4.

The semiconductor device 1a may include the logic device LT formed in the logic region LR and the memory cell 200 formed in the memory cell region MCRa. The memory cell 200 may include the lower electrode 210 and the resistance device 220 disposed on the lower electrode 210. The resistance device 220 may be a magnetoresistance device having an MTJ structure, a variable resistance device, or a phase change device.

The plurality of memory cells 200 may include the select memory cell 200S connected to the fifth wiring layer M5 and the dummy memory cells 200D1 and 200D2 that are not connected to the fifth wiring layer M5. The select memory cell 200S may further include an upper electrode 230 between the resistance device 220 and the fifth wiring layer M5. The first upper insulating layer 332 may be disposed between the dummy memory cells 200D1 and 200D2 and the fifth wiring layer M5, and thus the dummy memory cells 200D1 and 200D2 and the fifth wiring layer M5 may not be connected to each other.

Since the resistance device 220 of the memory cell 200 basically includes an insulating material, a charging effect may not concentrate on a portion of the select memory cell 200S during an etching process for forming the upper electrode 230. Thus, a dummy upper electrode for reducing or minimizing the charging effect may not be formed during a process of forming the upper electrode 230.

Figure 3B:
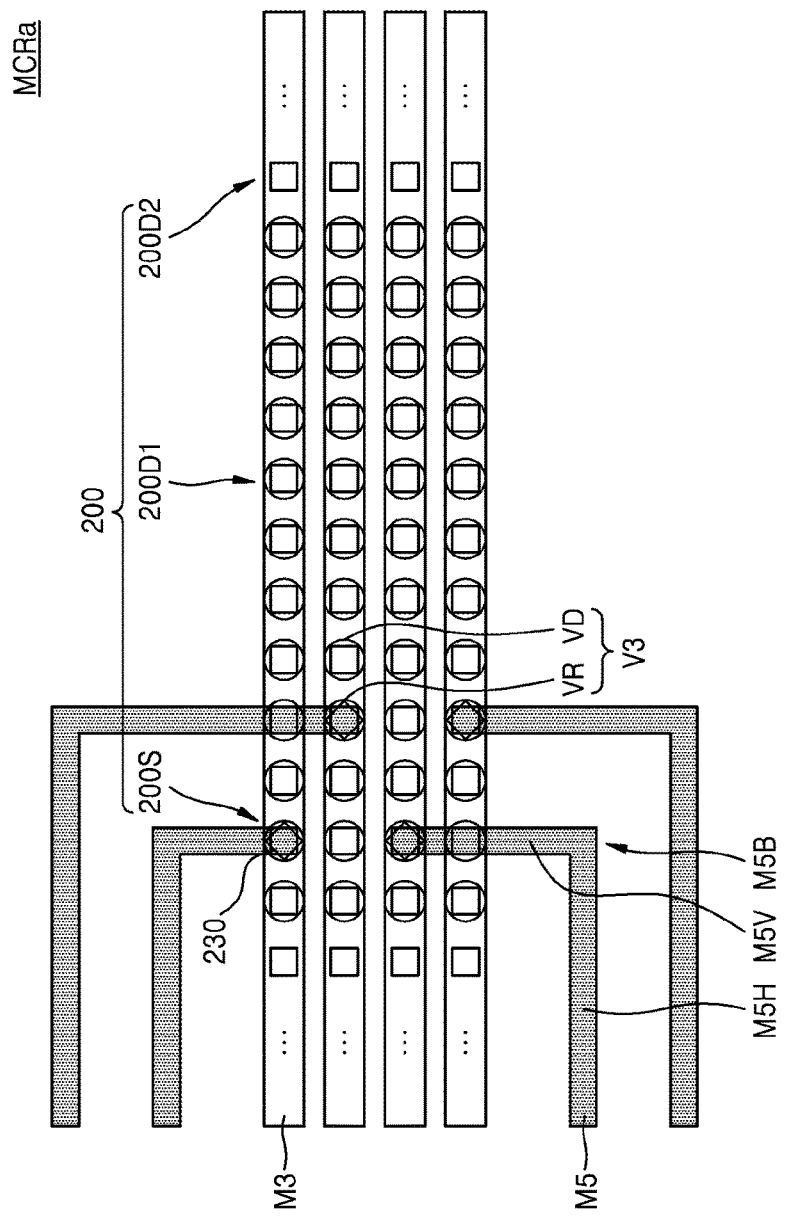
FIG. 3B is a schematic plan layout of a memory cell region of a semiconductor device according to example embodiments.

FIG. 3B is a schematic plan layout of the memory cell region MCRa of the semiconductor device 1a according to example embodiments.

Referring to FIG. 3B, the third wiring layer M3, and the plurality of third via plugs V3 which are connected to the third wiring layer M3 and disposed on the third wiring layer M3 may be formed in the memory cell region MCRa. The plurality of third via plugs V3 may be formed on the third wiring layer M3. The plurality of memory cells 200 may be formed on the third wiring layer M3. The plurality of via plugs V3 may be disposed between the third wiring layer M3 and at least some of the plurality of memory cells 200. The plurality of memory cells 200 may include the select memory cell 200S and the dummy memory cells 200D1 and 200D2. The upper electrode 230 that connects the select memory cell 200S and the fifth wiring layer M5 may be formed on the select memory cell 200S. The fifth wiring layer M5 may be connected to the select memory cell 200S through the upper electrode 230 and may not be connected to the dummy memory cells 200D1 and 200D2 in which the upper electrode 230 is not formed. When the plurality of third wiring layers M3 and the plurality of fifth wiring layers M5 are formed, the one fifth wiring layer M5 may overlap with the two or more third wiring layers M3 with the select memory cell 200S disposed between the one fifth wiring layer M5 and the two or more third wiring layer M3 in the memory cell region MCRa. Thus, the upper electrode 230 may be formed only on one of the memory cells 200 disposed between the two or more third wiring layer M3 that overlap with the one fifth wiring layer M5, i.e. the select memory cell 200S, and thus the one fifth wiring layer M5 may overlap with the one third wiring layer M3 with the select memory cell 200S disposed between the one fifth wiring layer M5 and the one third wiring layer M3.

Figure 4A:
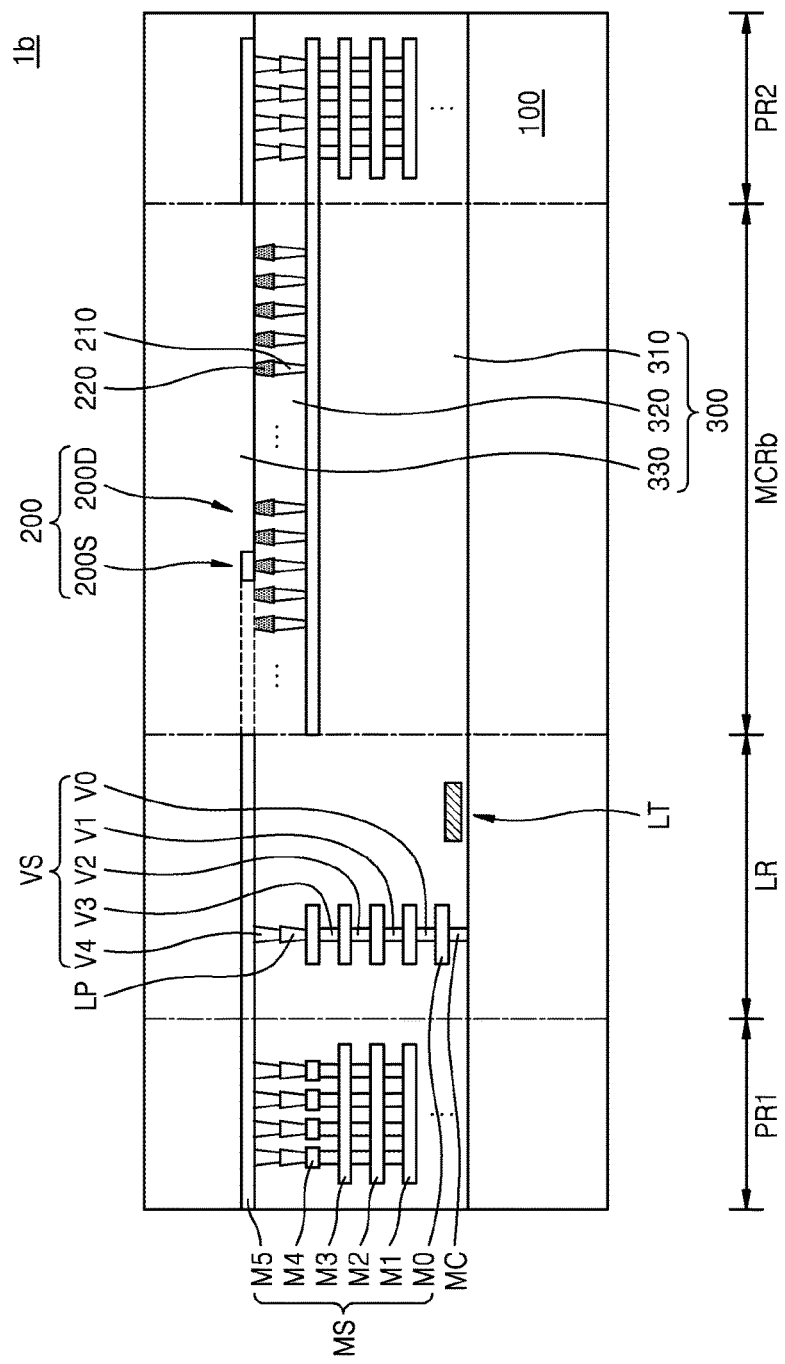
FIG. 4A is a cross-sectional view of a main part of a semiconductor device according to example embodiments.

FIG. 4A is a cross-sectional view of a main part of a semiconductor device 1b according to example embodiments. Redundant descriptions with respect to FIGS. 4A and 2A are omitted.

Referring to FIG. 4A, the semiconductor device 1b may include the logic region LR and a memory cell region MCRb.

The semiconductor device 1b may include the insulating layer 300 formed on the substrate 100 and the wiring structure MS and the via structure VS that are formed in the insulating layer 300.

The wiring structure MS and the via structure VS may be formed in the insulating layer 300. The wiring structure MS may include the plurality of wiring layers M0, M1, M2, M3, M4, and M5. For example, the plurality of wiring layers M0, M1, M2, M3, M4, and M5 may include the $0^{th}$ through fifth wiring layers M0, M1, M2, M3, M4, and M5. The via structure VS may include the plurality of via plugs V0, V1, V2, V3, and V4 that connect the plurality of wiring layers M0, M1, M2, M3, M4, and M5. For example, the plurality of via plugs V0, V1, V2, V3, and V4 may include the $0^{th}$ through fourth via plugs V0, V1, V2, V3, and V4.

The semiconductor device 1b may include the logic device LT formed in the logic region LR and the memory cell 200 formed in the memory cell region MCRb. The memory cell 200 may include the lower electrode 210 and the resistance device 220 disposed on the lower electrode 210. The resistance device 220 may be a magnetoresistance device having an MTJ structure, a variable resistance device, or a phase change device.

The plurality of memory cells 200 may be disposed on one wiring layer, i.e. the fourth wiring layer M4, along the one wiring layer in the memory cell region MCRb. The plurality of memory cells 200 may include the select memory cell 200S connected to the fifth wiring layer M5 and the dummy memory cell 200D that is not connected to the fifth wiring layer M5. The number of the dummy via plugs VD may be greater than the number of the real via plugs VR. For example, the number of the dummy via plugs VD may be several to several hundred times greater than the number of the real via plugs VR.

The memory cell 200 may be formed on the fourth wiring layer M4 and the third via plug V3 formed in the third wiring layer M3 in the memory cell region MCR of FIG. 2A, whereas the memory cell 200 may be directly formed on the fourth wiring layer M4 in the memory cell region MCRb of FIG. 4A.

In general, to form the memory cell 200, in particular, the lower electrode 210 of the memory cell 200, an etching process of forming a via hole in a portion of the insulating layer 300 may be performed and then a process of filling the via hole with a conductive material may be performed.

When dry etching is performed to form the via hole, charges may be transferred to a portion of the fourth wiring layer M4 adjacent to the via hole by ions, etc. used in dry etching. A lower surface and/or side surfaces of the fourth wiring layer M4 formed in the memory cell region MCRb may be surrounded by the lower insulating layer 310, and thus charges transferred to the fourth wiring layer M4 in the memory cell region MCRb may be transferred to the substrate 100 in a relatively long time.

Thus, a charging effect that charges increase may occur in the fourth wiring layer M4 of the memory cell region MCRb during dry etching for forming the via hole.

In particular, when only the select memory cell 200S is formed in the memory cell region MCRb, the charging effect may excessively occur. In this case, since an etchant including ions, etc. used in dry etching for forming the via hole may not reach the insulating layer 300, a not-open defect, that is, abnormal formation of the via hole, may occur. In this case, the lower electrode 210 of the select memory cell 200S may be electrically separated from the fourth wiring layer M4.

However, the semiconductor device 1b according to example embodiments may form the select memory cell 200S and the lower electrode 210 of the dummy memory cell 200D, thereby reducing or minimizing the charging effect, and thus the not-open defect may be reduced or prevented.

Figure 4B:
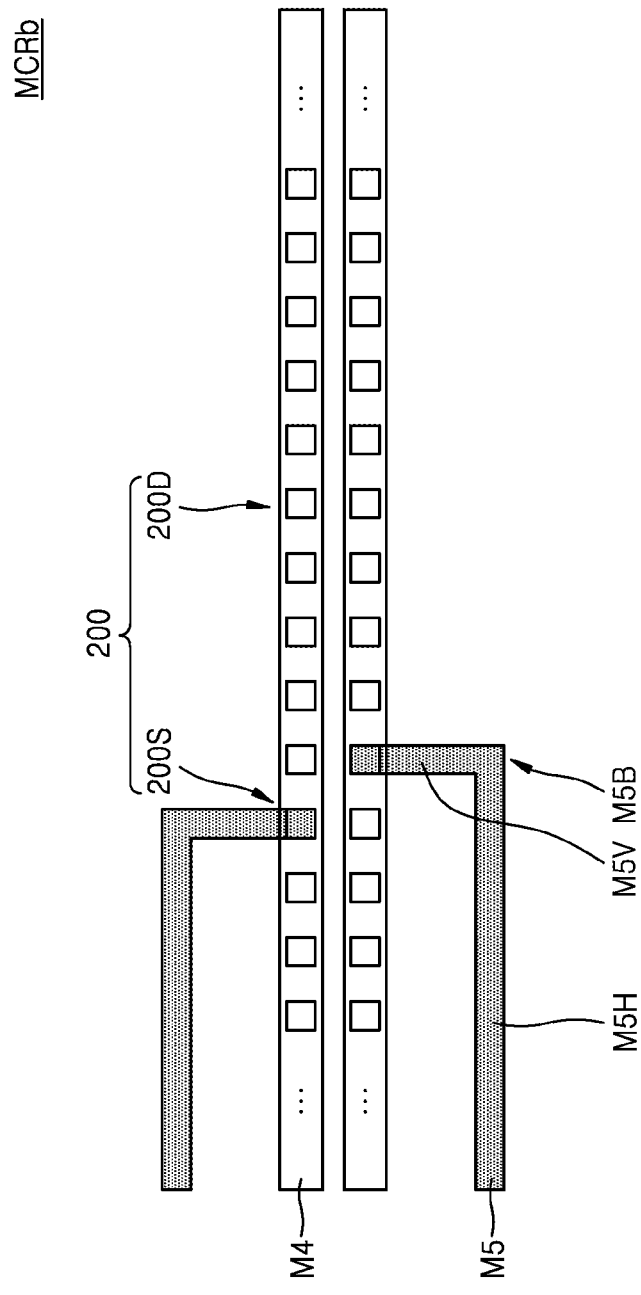
FIG. 4B is a schematic plan layout of a memory cell region of a semiconductor device according to example embodiments.

FIG. 4B is a schematic plan layout of the memory cell region MCRb of the semiconductor device 1b according to example embodiments. FIG. 4B is a schematic plan layout of an embodiment of a main part of the memory cell region MCRb of FIG. 4A.

Referring to FIG. 4B, the fourth wiring layer M4, and the plurality of memory cells 200 which are connected to the fourth wiring layer M4 and disposed on the fourth wiring layer M4 may be formed in the memory cell region MCRb. The plurality of memory cells 200 may include the select memory cell 200S and the dummy memory cell 200D. The fifth wiring layer M5 connected to the select memory cell 200S may be formed on the select memory cell 200S. The fifth wiring layer M5 may be connected to the select memory cell 200S and may not be connected to the dummy memory cell 200D. The fifth wiring layer M5 may include the first portion M5V extending in a different direction from an extension direction of the fourth wiring layer M4 and the second portion M5H extending in a different direction from an extension direction of the first portion M5V on the select memory cell 200S. Thus, the fifth wiring layer M5 may have the bending portion M5B between the first portion M5V and the second portion M5H. Accordingly, the one fifth wiring layer M5 may overlap with the one fourth wiring layer M4 with the select memory cell 200S disposed between the one fifth wiring layer M5 and the one fourth wiring layer M4 in the memory cell region MCRb.

Although not shown, in example embodiments, as shown in FIGS. 3A and 3B, the select memory cell 200S of the memory cell region MCRb of the semiconductor device 1b may further include the upper electrode 230 formed on the resistance device 220.

Figure 5A:
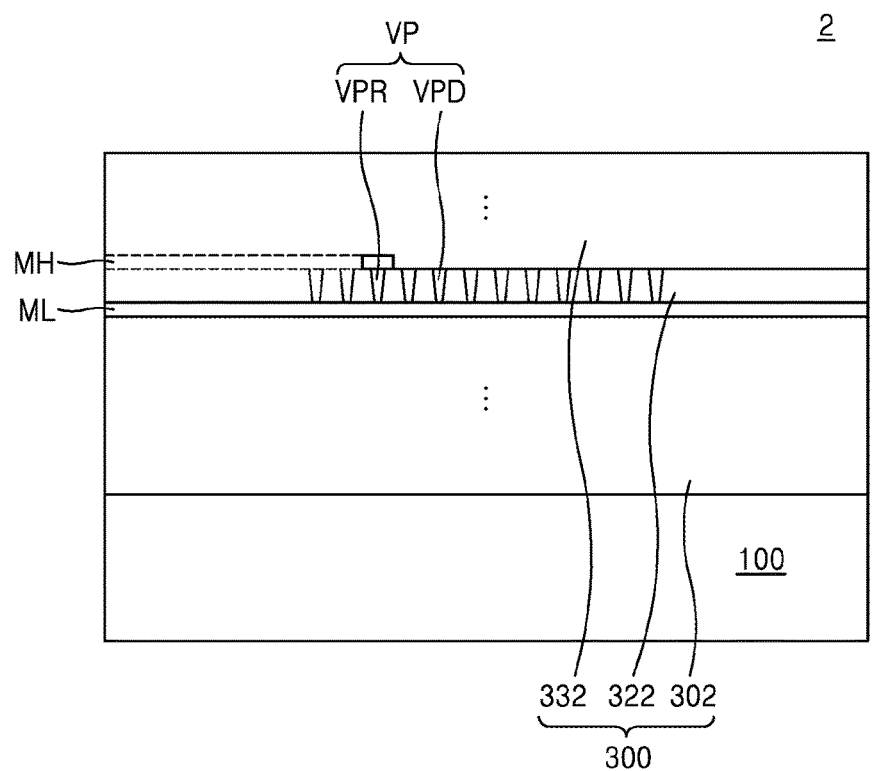
FIG. 5A is a cross-sectional view of a main part of a semiconductor device according to example embodiments.

FIG. 5A is a cross-sectional view of a main part of a semiconductor device 2 according to example embodiments.

Referring to FIG. 5A, the semiconductor device 2 may include an insulating layer 302 formed on the substrate 100, a lower wiring layer ML, an upper wiring layer MH, and a via plug VP disposed on the lower wiring layer ML and the upper wiring layer MH that are formed in the insulating layer 302.

The insulating layer 302 may include an intermediate layer 322 surrounding the via plug VP at the same level as the via plug VP and a lower insulating layer 312 and an upper insulating layer 332 that are respectively formed in a lower side and an upper side of the intermediate insulating layer 322.

The plurality of via plugs VP connected to the lower wiring layer ML may be disposed on a portion of the lower wiring layer ML having a lower surface surrounded by the lower insulating layer 312 in an extension direction of the lower wiring layer ML. The upper wiring layer MH connected to some of the plurality of via plugs VP may be formed on the plurality of via plugs VP. The plurality of via plugs VP may include a real via plug VPR that is connected to the upper wiring layer MH and a dummy via plug VPD that is not connected to the upper wiring layer MH.

The upper insulating layer 332 may cover upper surfaces of the real via plug VPR and the dummy via plug VPD and the upper wiring layer MH.

The number of the dummy via plugs VPD formed on the one lower wiring layer ML of the semiconductor device 2 may be greater than the number of the real via plugs VPS. For example, the number of the dummy via plugs VPD may be several to several hundred times greater than the number of the real via plugs VPS.

The lower insulating layer 312 may surround lower surfaces and/or side surfaces of a portion of the lower wiring layer ML in which the real via plug VPR is formed and a portion of the lower wiring layer ML relatively close to the real via plug VPR. Thus, during dry etching for forming a via hole used to form the via plug VP, a charging effect that charges concentrate may occur in a portion of the lower wiring layer ML adjacent to the via hole, a not-open defect that the via hole is not normally formed may occur.

However, the semiconductor device 2 according to example embodiments may form the real via plug VPR and the dummy via plug VPD, thereby reducing or minimizing the charging effect, and thus the not-open defect may be reduced or prevented. More specifically, charges that may concentrate on a portion of the lower wiring layer ML adjacent to the real via plug VPR may be distributed in portions of the lower wiring layer ML adjacent to the dummy via plug VPD, thereby reducing or preventing the not-open defect.

Figure 5B:
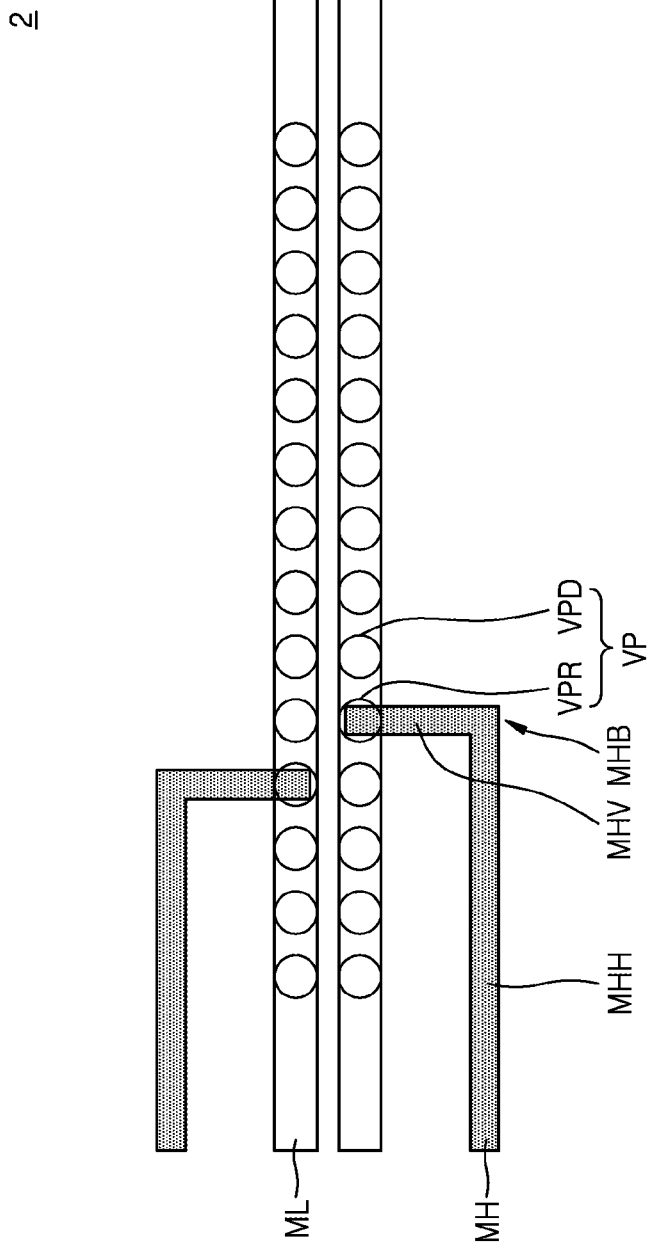
FIG. 5B is a schematic plan layout of a semiconductor device according to example embodiments.

FIG. 5B is a schematic plan layout of the semiconductor device 2 according to example embodiments.

Referring to FIG. 5B, the lower wiring layer ML and the plurality of via plugs VP may be formed in the semiconductor device 2, wherein the plurality of via plugs VP are disposed on and connected to the lower wiring layer ML. The plurality of via plugs VP may include the real via plug VPR and the dummy via plug VPD. The upper wiring layer MH connected to the real via plug VPR may be formed on the real via plug VPR. The upper wiring layer MH may be connected to the real via plug VPR and may not connected to the dummy via plug VPD. The upper wiring layer MH may include a first portion MHV extending in a different direction from an extension direction of the lower wiring layer ML and a second portion MHH extending in a different direction from an extension direction of the first portion MHV on the real via plug VPR. Thus, the upper wiring layer MH may have a bending portion MHB between the first portion MHV and the second portion MHH.

Accordingly, the one upper wiring layer MH may overlap with the one lower wiring layer ML with the real via plug VPR disposed between the one upper wiring layer MH and the one lower wiring layer ML, and the upper wiring layer MH may not overlap with the dummy via plug VPD formed on the overlapped one lower wiring layer ML.

In example embodiments, the two or more real via plugs BPR may be formed between the one lower wiring layer ML and the one upper wiring layer MH, thereby commonly coupling the one lower wiring layer ML and the one upper wiring layer MH.

Figure 6:
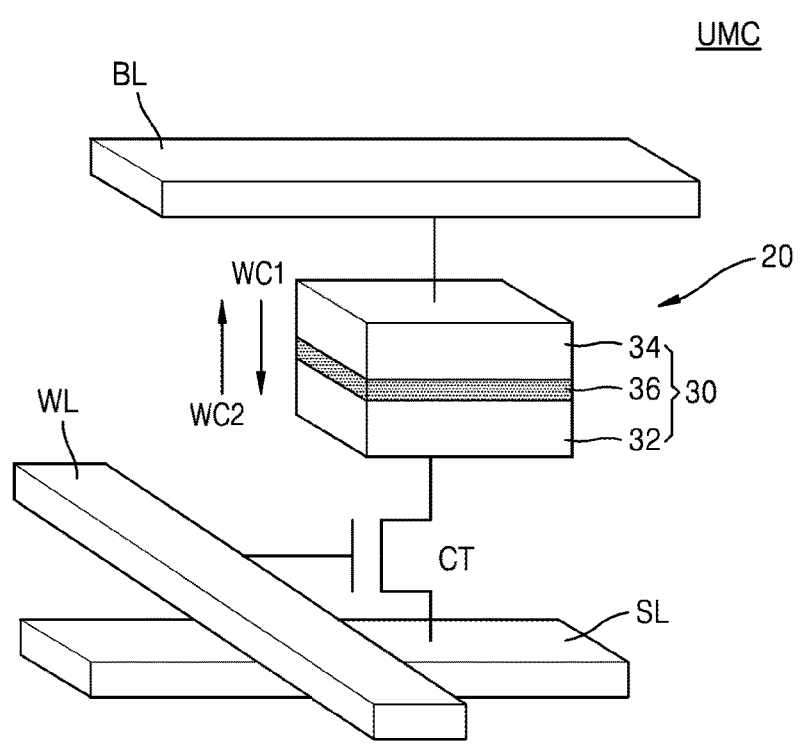
FIG. 6 is a view of a schematic configuration of a unit memory cell of a semiconductor device according to example embodiments.

FIG. 6 is a view of a schematic configuration of a unit memory cell of a semiconductor device according to example embodiments. FIG. 6 shows a case where one memory cell included in a semiconductor device, in particular, the select memory cell 200S of FIGS. 2A through 4B, configures a unit magnetic device UMC.

Referring to FIG. 6, the unit magnetic device UMC included in the semiconductor device may include a memory cell 20 including spin transfer torque magnetic random access memory (STT-MRAM).

The memory cell 20 may include a magnetoresistance device 30 having an MTJ structure and a cell transistor CT. A gate of the cell transistor CT may be connected to a word line WL, one electrode of the cell transistor CT may be connected to a bit line BL through the magnetoresistance device 30, and another electrode of the cell transistor CT may be connected to a source line SL.

The magnetoresistance device 30 may include a free layer 32, a pinned layer 34, and a tunnel barrier layer 36 disposed between the free layer 32 and the pinned layer 34. The free layer 32 may have a magnetization easy axis in a direction perpendicular to an extension direction of the free layer 32 and may have a variable magnetization direction according to conditions. The pinned layer 34 may have a magnetization easy axis in a direction perpendicular to an extension direction of the pinned layer 34 and may have a pinned magnetization direction.

Each of the free layer 32 and the pinned layer 34 may include a magnetic material having high magnetic anisotropy energy. The magnetic material having high magnetic anisotropy energy may include an amorphous rare earth element alloy, a multilayer thin film such as (Co/Pt)n or (Fe/Pt), a super lattice material with an L10 crystalline structure, etc.

In example embodiments, at least one of the free layer 32 and the pinned layer 34 may include at least one selected from Fe, Co, Ni, Pd, and Pt. In example embodiments, at least one of the free layer 32 and the pinned layer 34 may include a Co-M1 alloy (in this regard, M1 is metal of at least one selected from Pt, Pd, and Ni) or a Fe-M2 alloy (in this regard, M2 is metal of at least one selected from Pt, Pd, and Ni). In example embodiments, at least one of the free layer 32 and the pinned layer 34 may further include at least one material selected from B, C, Cu, Ag, Au, Ru, Ta, and Cr.

The free layer 32 and the pinned layer 34 may be respectively referred to as a first magnetization layer 32 and a second magnetization layer 34.

The tunnel barrier 36 may include a non-magnetic material. The tunnel barrier 36 may include, for example, oxide of one material selected from Mg, Ti, Al, MgZn, and MgB. In example embodiments, the tunnel barrier 36 may include Ti nitride or vanadium (V) nitride. The tunnel barrier 36 may have a smaller thickness than a spin diffusion distance.

A resistance value of the magnetoresistance device 30 may differ depending on a magnetization direction. When a magnetization direction of the free layer 32 and a magnetization direction of the pinned layer 34 are parallel to each other, the magnetoresistance device 30 may have a low resistance value and may store data '0'. When the magnetization direction of the free layer 32 and the magnetization direction of the pinned layer 34 are antiparallel to each other, the magnetoresistance device 30 may have a high resistance value and may store data '1'.

In FIG. 6, layouts of the free layer 32 and the pinned layer 34 are not limited to an illustrated example and locations thereof may be switched.

The unit magnetic device UMC of FIG. 6 may apply a logic high voltage to the word line WL to turn on the cell transistor CT and may apply write current WC1 and WC2 between the bit line BL and the source line SL for a write operation of the STT-MRAM. In this regard, the magnetization direction of the free layer 32 may be determined according to directions of the write current WC1 and WC2. The magnetization direction of the free layer 32 in the magnetoresistance device 30 may change according to a spin transfer torque (STT) phenomenon.

In the STT phenomenon, when a spin polarized current flows in one direction, a magnetization direction of a magnetic layer changes according to a spin transfer of electrons. Accordingly, MRAM using the STT phenomenon may be referred to as STT-RAM or STT-MRAM.

More specifically, if the write current WC1 and WC2 flow to an MTJ, i.e., the magnetoresistance device 30, in the STT-MRAM, the pinned layer 34 may polarize electron spins of the write current WC1 and WC2, and a spin polarized electron current may apply a torque to the free layer 32 and may interact with the free layer 32. If a torque created by the spin polarized electron current passing through the MTJ is greater than a threshold switching current density, the torque applied to the spin polarized electron current may sufficiently switch the magnetization direction of the free layer 32. Accordingly, the magnetization direction of the free layer 32 may be parallel or antiparallel to the pinned layer 34 and a resistance state of the magnetoresistance device 30 may be changed.

As described above, the STT-MRAM may switch the magnetization direction of the free layer 32 through the spin polarized electron current, and thus, occurrence of a magnetic field by applying a strong current may be unnecessary for switching the magnetization direction of the free layer 32. Accordingly, the STT-MRAM may allow reduction of a cell size and of a programming current, so that a write obstacle problem may be addressed. In addition, the STT-MRAM may have a high tunnel magnetoresistance ratio and also a high ratio of high to low resistance states, thereby enhancing a read operation in a magnetic domain.

The unit magnetic device UMC of FIG. 6 may apply the logic high voltage to the word line WL to turn on the cell transistor CT and may apply a read current from the bit line BL to the source line SL to determine data stored in the magnetoresistance device 30. In this regard, an intensity of the read current is much lower than an intensity of the write current WC1 and WC2, and thus, the magnetization direction of the free layer 32 may not be changed by the read current.

In example embodiments, the bit line BL may be the fifth wiring layer M5 of FIGS. 2A through 4B but is not limited thereto. In example embodiments, each of the source line SL and the word line WL may be one of the $0^{th}$ through second wiring layers M2 of FIGS. 2A through 4B or may be a conductive line or a conductive region formed in a lower portion of the $0^{th}$ wiring layer M0. The cell transistor CT may be formed in the memory cell regions MCR, MCRa, and MCRb of FIGS. 2A, 3A, and 4A but is not limited thereto. The cell transistor CT may be formed in the logic region LT other than the memory cell regions MCR, MCRa, and MCRb.

FIGS. 7 through 11 are cross-sectional views for describing variable resistance structures 50A, 50B, 50C, 50D, and 50E of various structures that may be included in a semiconductor device according to example embodiments.

Figure 7:
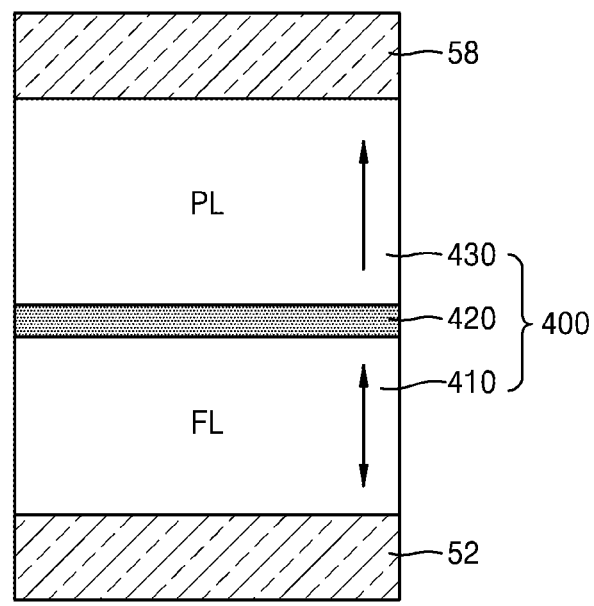
FIGS. 7 through 11 are cross-sectional views for describing variable resistance structures that may be included in a semiconductor device according to example embodiments.

Referring to FIG. 7, the semiconductor device according to example embodiments may include the variable resistance structure 50A having a magnetoresistance device 400.

In example embodiments, the magnetoresistance device 400 and the variable resistance structure 50A of FIG. 7 may configure the resistance device 220 and the memory cell 200 of FIGS. 2A through 4B.

The variable resistance structure 50A may include the magnetoresistance device 400. The magnetoresistance device 400 may be disposed between a lower electrode 52 and an upper electrode 58. In this regard, the upper electrode 58 may correspond to a portion of the fifth wiring layer M5 adjacent to the upper electrode 230 of FIG. 3A and the resistance device 220 of FIGS. 2A and 4A. The magnetoresistance device 400 may include a free layer FL 410, a pinned layer PL 430, and a tunnel barrier layer 420 disposed between the free layer FL 410 and the pinned layer PL 430.

The free layer FL 410 may have a magnetization easy axis in a direction perpendicular to a surface of a layer constituting the free layer FL 410 and may have a variable magnetization direction according to conditions. The pinned layer PL 430 may have a magnetization easy axis in a direction perpendicular to a surface of a layer constituting the pinned layer 34 and may have a pinned magnetization direction. A resistance value of the magnetoresistance device 400 may differ depending on a magnetization direction of the free layer FL 410. When the magnetization direction of the free layer FL 410 and a magnetization direction of the pinned layer PL 430 are parallel to each other, the magnetoresistance device 400 may have a low resistance value and may store data '0'. When the magnetization direction of the free layer FL 410 and the magnetization direction of the pinned layer PL 430 are antiparallel to each other, the magnetoresistance device 400 may have a high resistance value and may store data ' 1'. In FIG. 7, layouts of the free layer FL 410 and the pinned layer PL 430 are not limited to an illustrated example and locations thereof may be switched. Alternatively, data stored in the magnetoresistance device 400 may be opposite according to the magnetization direction of the free layer FL 410.

Each of the free layer FL 410 and the pinned layer PL 430 may have an interface perpendicular magnetic anisotropy (IPMA) at an interface (i.e. a contact surface) of the tunnel barrier layer 420.

To this end, the free layer FL 410 and the pinned layer PL 430 may include a ferromagnetic material. The ferromagnetic material may have relatively high magnetic anisotropy energy Ku, for example, from 106 to 107 erg/cc. The free layer FL 410 and the pinned layer PL 430 may have magnetic easy axes perpendicular to the interface due to such high magnetic anisotropy energy Ku.

The free layer FL 410 may be a magnetic layer having a variable magnetization direction. That is, the free layer FL 410 may include a ferromagnetic material having a magnetic moment of which magnetization direction freely varies with respect to a direction perpendicular to a layer surface, for example, at least one of Co, Fe, and Ni, and may further include another element such as B, Cr, Pt, Pd, etc. The free layer FL 410 may include a different material from the pinned layer PL 430 and may include the same material as pinned layer PL 430.

The pinned layer PL 430 may be a magnetic layer having a pinned magnetization direction, may include a ferromagnetic material that is at least one of Co, Fe, and Ni, and may further include another element such as B, Cr, Pt, Pd, etc.

The pinned layer PL 430 is illustrated as a single layer in the present embodiment but is not limited thereto. The pinned layer PL 430 may have a multilayer structure.

In example embodiments, the pinned layer PL 430 may have a multilayer structure in which a first layer including at least one of Co and a Co alloy and a second layer including at least one of Pt, Ni, and Pd are alternately stacked, may be a FePt layer or a CoPt layer that has an L10 structure, or may be an alloy layer of a rare earth element and transition metal. In this regard, the rare earth element may be at least one of Tb and Gd, and the transition metal may be at least one of Ni, Fe, and Co. An alloy of various combinations of the rare earth element and the transition metal may be used. For example, CoFeB or CoFe may be used as a material of the pinned layer PL 430.

The tunnel barrier layer 420 may be disposed between the free layer FL 410 and the pinned layer PL 430 in order to increase a tunnel magnetoresistance ratio (TMR) of the magnetoresistance device 400. The tunnel barrier layer 420 may have a thickness from about 8 to about 15 Å. The tunnel barrier layer 420 may have a thickness smaller than a spin diffusion distance. The tunnel barrier layer 420 may include a non-magnetic material. The tunnel barrier layer 420 may include, for example, at least one selected from oxide of magnesium (Mg), titanium (Ti), aluminum (Al), magnesium-zinc (MgZn), and magnesium-boron (MgB) and nitride of titanium (Ti) and vanadium (V). The tunnel barrier layer 420 may have, for example, a multilayer structure.

In example embodiments, the free layer FL 410, the tunnel barrier layer 420, and the pinned layer PL 430 may have the same crystalline structure. For example, each of the free layer FL 410, the tunnel barrier layer 420, and the pinned layer PL 430 may a body centered cubic (BCC) crystalline structure.

Figure 8:
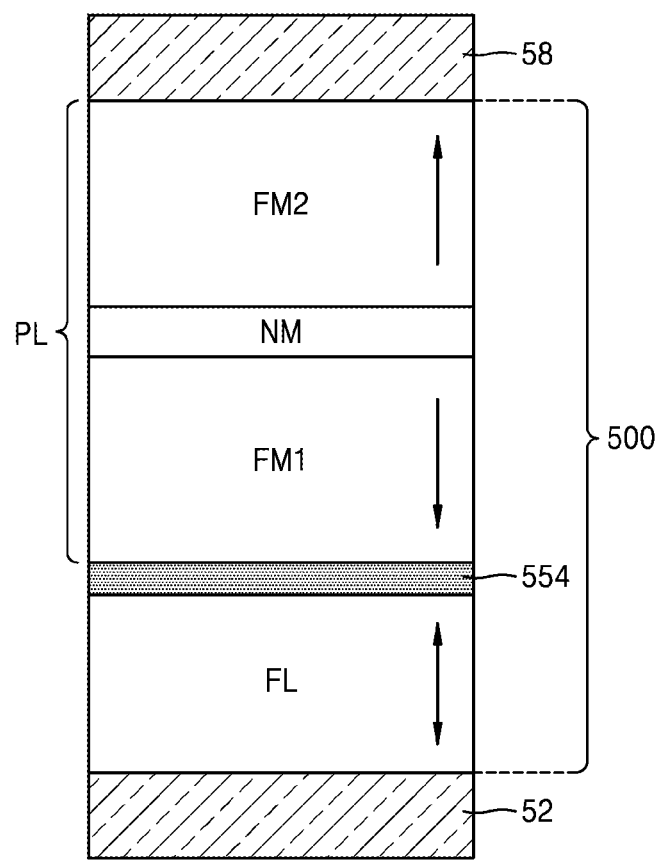

Referring to FIG. 8, the device according to example embodiments may include the variable resistance structure 50B having a magnetoresistance device 500.

In example embodiments, the magnetoresistance device 500 and the variable resistance structure 50B of FIG. 8 may configure the resistance device 220 and the memory cell 200 of FIGS. 2A through 4B.

The variable resistance structure 50B may include the magnetoresistance device 500 disposed between the lower electrode 52 and the upper electrode 58. The magnetoresistance device 500 may include the free layer FL, the pinned layer PL having a synthetic antiferromagnets (SAF) structure, and a tunnel barrier layer 554 disposed between the free layer FL and the pinned layer PL.

The pinned layer PL may include two ferromagnetic layers FM1 and FM2 that are separated from each other by a non-magnetic thin film NM. An antiferromagnetic coupling characteristic may exhibit in the SAF structure due to a Ruderman-Kittel-Kasuya-Yosida (RKKY) interaction by the non-magnetic thin film NM inserted between the two ferromagnetic layers FM1 and FM2. Magnetic domains of each of the ferromagnetic layers FM1 and FM2 may be arranged in opposite directions by the antiferromagnetic coupling characteristic that interacts between the ferromagnetic layers FM1 and FM2 and thus an entire magnetization amount of the SAF structure may be reduced or minimized.

If a magnetic field applied from the outside to the free layer FL gradually increases and arrives at a switching field that is a threshold value of magnetization switching, an electric resistance value may be instantly changed by a magnetization switching phenomenon.

In example embodiments, the ferromagnetic layers FM1 and FM2 may include CoFeB, CoFe, NiFe, FePt, CoPt, etc. The non-magnetic thin film NM may include a single metal selected from the group consisting of Ru, Cr, Pt, PD, IR, Rh, Ru, Os, Re, Au, and Cu or an alloy of these.

Figure 9:
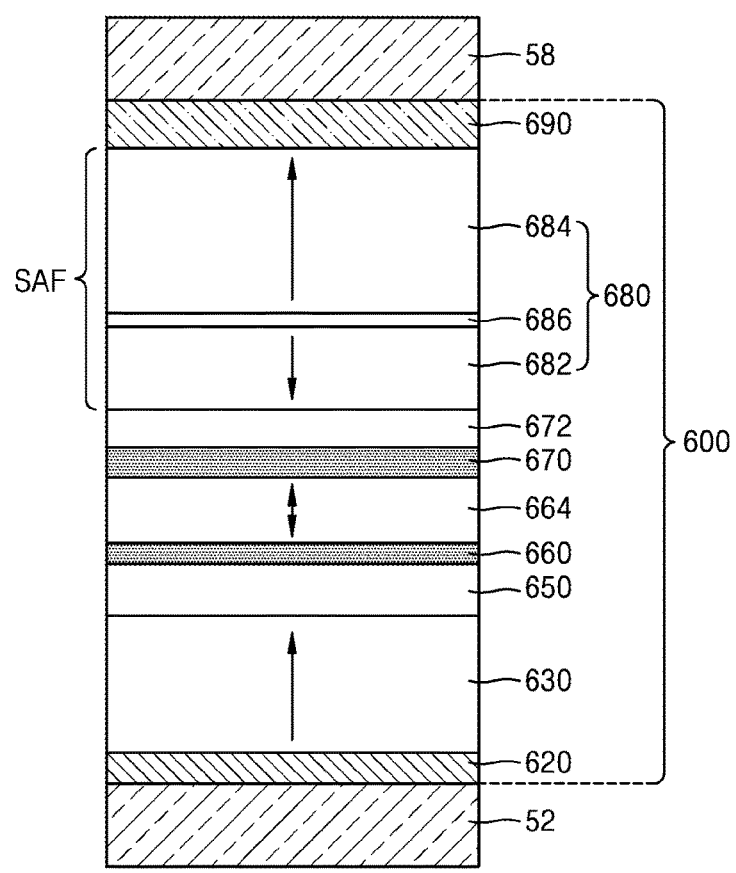

Referring to FIG. 9, the device according to example embodiments may include the variable resistance structure 50C having a magnetoresistance device 600.

In example embodiments, the magnetoresistance device 600 and the variable resistance structure 50C of FIG. 9 may configure the resistance device 220 and the memory cell 200 of FIGS. 2A through 4B.

The variable resistance structure 50C may include the magnetoresistance device 600 disposed between the lower electrode 52 and the upper electrode 58. The magnetoresistance device 600 may include a seed layer 620 formed on the lower electrode 52 and a lower pinned layer 630 formed on the seed layer 620. The seed layer 620 may include, for example, Ru, Pt, or Pd.

In example embodiments, a buffer layer (not shown) may be disposed between the lower electrode 52 and the seed layer 620. The buffer layer may match a crystalline structure of the lower electrode 52 and a crystalline structure of the seed layer 620 between the lower electrode 52 and the seed layer 620. For example, the buffer layer may include Ta.

The lower pinned layer 630 may offset a leakage magnetic field in an upper pinned layer 680 having an SAF structure to provide a stable switching characteristic. The lower pinned layer 630 may have a magnetization easy axis in a direction perpendicular to a surface contacting the seed layer 620. A magnetization direction of the lower pinned layer 630 may not be changed. In FIG. 9, the magnetization direction of the lower pinned layer 630 is illustrated as an opposite direction to the lower electrode 52, i.e., a direction toward the upper pinned layer 680, but is not limited thereto. The magnetization direction of the lower pinned layer 630 may direct the lower electrode 52.

In example embodiments, the lower pinned layer 630 may include a Co based perpendicular pinned layer. According to an embodiment, the lower pinned layer 630 may have a [Co/Pt]X n (n: a repeating number of times) stack structure in which a Co layer having a thickness from about 1 to about 5 Å and a Pt layer having a thickness from about 1 to about 5 Å are alternately stacked a plurality of times. In example embodiments, the lower pinned layer 630 may have a [Co/Pd]X n (n: a repeating number of times) stack structure in which the Co layer having the thickness from about 1 to about 5 Å and a Pd layer having a thickness from about 1 to about 5 Å are alternately stacked a plurality of times.

The lower pinned layer 630 may be formed through an ultrathin film epitaxial growth process by a solid phase epitaxy growth. For example, the lower pinned layer 630 may be formed through a molecular beam epitaxy (MBE) process or a metal organic CVD (MOCVD) process. The lower pinned layer 630 may be formed at a processing temperature of a relatively low temperature from about 200 to about 400° C. For example, the lower pinned layer 630 may be formed at a temperature of about 300° C. The lower pinned layer 630 may have a thickness from about 20 to about 30 Å.

A first polarization reinforcement layer 650 for increasing a spin polarization in the lower pinned layer 730 may be formed on the lower pinned layer 630. The first polarization reinforcement layer 650 may include a CoFeB magnetic layer. A magnetization direction of the first polarization reinforcement layer 650 may be the same as a magnetization direction of the lower pinned layer 630. The first polarization reinforcement layer 650 may have a thickness from about 10 to about 20 Å. In example embodiments, the first polarization reinforcement layer 650 may be omitted.

A first tunnel barrier layer 660 may be formed on the first polarization reinforcement layer 650. A free layer 664 having a variable magnetization direction may be formed on the first tunnel barrier layer 660. A second tunnel barrier layer 670 may be formed on the free layer 664. The upper pinned layer 680 may be formed on the second tunnel barrier layer 670.

The first tunnel barrier layer 660 and the second tunnel barrier layer 670 may include a non-magnetic material. In example embodiments, each of the first tunnel barrier layer 660 and the second tunnel barrier layer 670 may include oxide of one material selected from Mg, Ti, Al, MgZn, and MgB. In example embodiments, each of the first tunnel barrier layer 660 and the second tunnel barrier layer 670 may include Ti nitride or vanadium (V) nitride. In example embodiments, at least one of the first tunnel barrier layer 660 and the second tunnel barrier layer 670 may include a single layer. In example embodiments, at least one of the first tunnel barrier layer 660 and the second tunnel barrier layer 670 may include a multilayer including a plurality of layers. For example, at least one of the first tunnel barrier layer 660 and the second tunnel barrier layer 670 may have a multiple layer structure selected from Mg/MgO, MgO/Mg, and Mg/MgO/Mg. A thickness of the second tunnel barrier layer 670 may be greater than that of the first tunnel barrier layer 660.

The magnetoresistance device 600 of the variable resistance structure 50C of FIG. 9 may provide a dual MTJ structure including the first tunnel barrier layer 660 and the second tunnel barrier layer 670. When current is supplied through the dual MTJ structure including the first tunnel barrier layer 660 and the second tunnel barrier layer 670, the free layer 664 may perform switching between stable magnetic states. The magnetoresistance device 600 may have the dual MTJ structure, and thus a more highly integrated magnetic device may provide an enhanced performance. In example embodiments, the first tunnel barrier layer 660 may be omitted.

A second polarization enhancement layer 672 may be disposed between the second tunnel barrier layer 670 and the upper pinned layer 680. The second polarization enhancement layer 672 may include a ferromagnetic material selected from Co, Fe, and Ni. The second polarization enhancement layer 672 may have a high spin polarization ratio and a low damping constant. To this end, the second polarization enhancement layer 672 may further include a non-magnetic material selected from B, Zn, Ru, Ag, Au, Cu, C, and N. In example embodiments, the second polarization enhancement layer 672 may include a CoFeB magnetic layer. The second polarization enhancement layer 672 may have a thickness from about 10 to about 20 Å. In example embodiments, the second polarization enhancement layer 672 may be omitted.

The upper pinned layer 680 may include a first upper pinned layer 682, a second upper pinned layer 684, and an exchange coupling layer 686 disposed between the first upper pinned layer 682 and the second upper pinned layer 684. The first upper pinned layer 682 may have a magnetic moment antiparallel to a magnetic moment of the lower pinned layer 630. The second upper pinned layer 684 may have a magnetic moment antiparallel to the magnetic moment of the first upper pinned layer 682.

The upper pinned layer 680 may have an SAF structure described with respect to the perpendicular pinned layer PL of FIG. 8. In this regard, the first upper pinned layer 682 and the second upper pinned layer 684 may correspond to the two ferromagnetic layers FM1 and FM2. The exchange coupling layer 686 may correspond to the non-magnetic thin film NM inserted between the two ferromagnetic layers FM1 and FM2.

The second polarization enhancement layer 672 may increase a spin polarization in the first upper pinned layer 682. A magnetization direction of the second polarization enhancement layer 672 may be the same as a magnetization direction of the first upper pinned layer 682.

A capping layer 690 may be formed on the upper pinned layer 680. The capping layer 690 may include at least one material selected from Ru, Ta, Al, Cu, Au, Ag, Ti, TaN, and TiN.

In the magnetoresistance device 600 of FIG. 9, according to directions of electrons flowing through the dual MTJ structure, a resistance value of a magnetic device may be different. A difference in the resistance value may be used to store data in a memory cell including the magnetic device.

Figure 10:
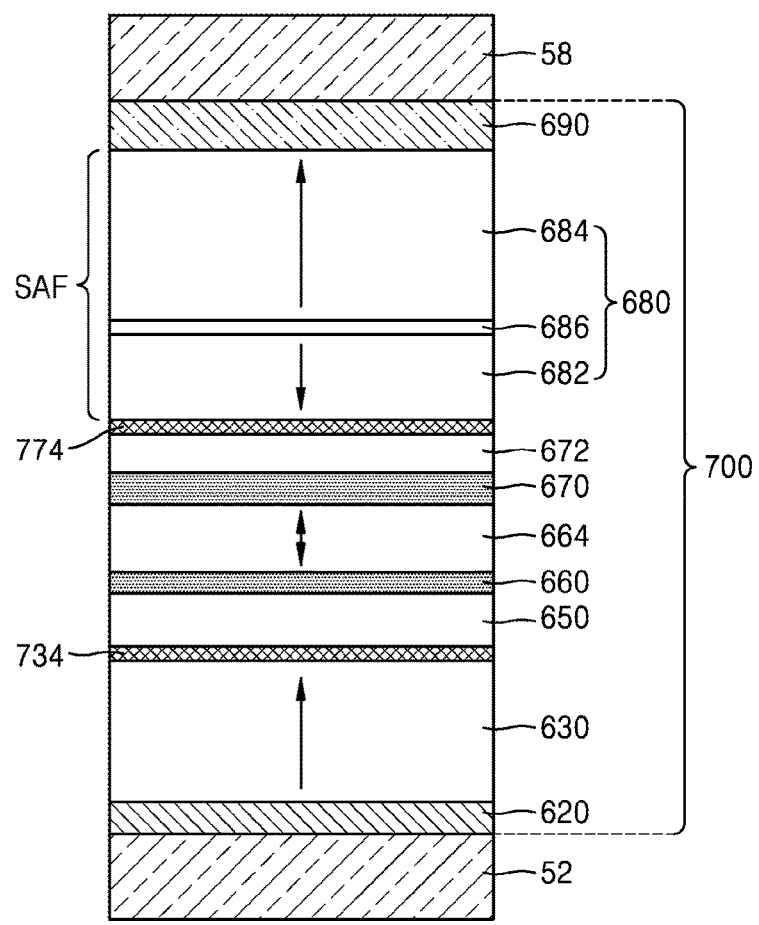

Referring to FIG. 10, the device according to example embodiments may include the variable resistance structure 50D having a magnetoresistance device 700.

In example embodiments, the magnetoresistance device 700 and the variable resistance structure 50D of FIG. 10 may configure the resistance device 220 and the memory cell 200 of FIGS. 2A through 4B.

The magnetoresistance device 700 of the variable resistance structure 50D may generally have the same configuration as the magnetoresistance device 600 of the variable resistance structure 50C of FIG. 9, except that the magnetoresistance device 700 of the variable resistance structure 50D further includes a first amorphous layer 734 disposed between the lower pinned layer 730 an the first polarization reinforcement layer 650 and a second amorphous layer 774 disposed between the second polarization reinforcement layer 672 and the first upper pinned layer 682.

In example embodiments, each of the first amorphous layer 734 and the second amorphous layer 774 may include Ta. In example embodiments, each of the amorphous layer 734 and the second amorphous layer 774 may have a thickness from about 1 to about 6 Å but the inventive concepts are not limited thereto.

Figure 11:
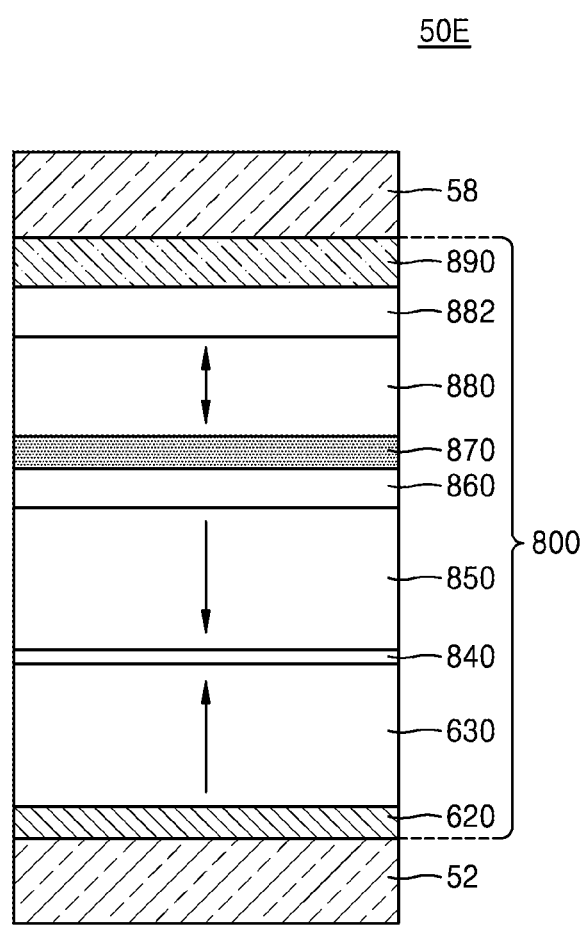

Referring to FIG. 11, the device according to example embodiments may include the variable resistance structure 50E having a magnetoresistance device 800.

In example embodiments, the magnetoresistance device 800 and the variable resistance structure 50E of FIG. 11 may configure the resistance device 220 and the memory cell 200 of FIGS. 2A through 4B.

The magnetoresistance device 800 of the variable resistance structure 50E may include the seed layer 620 formed on the lower electrode 52 as described with reference to FIG. 10 above. The lower pinned layer 630 having a perpendicular magnetic anisotropy may be formed on the seed layer 620. An exchange coupling layer 840 and an upper pinned layer 850 may be sequentially formed on the lower pinned layer 630. The upper pinned layer 850 may have a magnetic moment antiparallel to a magnetic moment of the lower pinned layer 630. Detailed configurations of the exchange coupling layer 840 and the upper pinned layer 850 may be generally the same as described with respect of the exchange coupling layer 686 and the second upper pinned layer 684 of FIG. 10.

A polarization reinforcement layer 860, a tunnel barrier layer 870, a free layer 880, a nano-oxide layer (NOL) 882, and a capping layer 890 may be sequentially formed on the upper pinned layer 850.

The polarization reinforcement layer 860 may include a CoFeB magnetic layer. The tunnel barrier layer 870 may include a non-magnetic material. The tunnel barrier layer 870 may generally have the same configuration as described with respect to the second tunnel barrier layer 970 of FIG. 10.

The NOL 882 may include Ta oxide or Mg oxide. In example embodiments, the NOL 882 may be omitted.

A detail configuration of the capping layer 890 may be generally the same as described with respect to the capping layer 690 of FIG. 10.

As illustrated in FIGS. 7 through 11, each of the magnetoresistance devices 400, 500, 600, 700, and 800 has a magnetization easy axis in a direction perpendicular to a surface of a layer of a corresponding layer, but the present inventive concepts are not limited thereto. According to some embodiment, the magnetization easy axis may be in a direction horizontal of the surface of the layer of the corresponding layer.

FIG. 12A through 12F are cross-sectional views for sequentially describing a method of manufacturing a semiconductor device according to example embodiments. More specifically, FIG. 12A through 12F are cross-sectional views for describing a method of manufacturing the semiconductor device 1 of FIGS. 12A through 12F.

Referring to FIG. 12A, the lower insulating layer 310 may be formed on the substrate 100 including the logic region LR, the memory cell region MCR, and the pad regions PR1 and PR2, and the contact plug MC, the $0^{th}$ through second via plugs V0, V1, and V2, and the $0^{th}$ through third wiring layers M0, M1, M2, and M3 may be formed in the lower insulating layer 310. The logic device LT may be formed in the logic region LR.

The third wiring layer M3 may be insulated from the substrate 100 in the memory cell region MCR. A lower surface and/or side surfaces of the third wiring layer M3 may be surrounded by the lower insulating layer 310 in the memory cell region MCR and may not be electrically connected to the substrate 100 in the memory cell region MCR. However, it does not mean that the third wiring layer M3 is electrically insulted from the substrate 100 and may be electrically connected to the substrate 100 through the logic region LR and/or the pad regions PR1 and PR2 other than the memory cell region MCR.

Figure 12B:
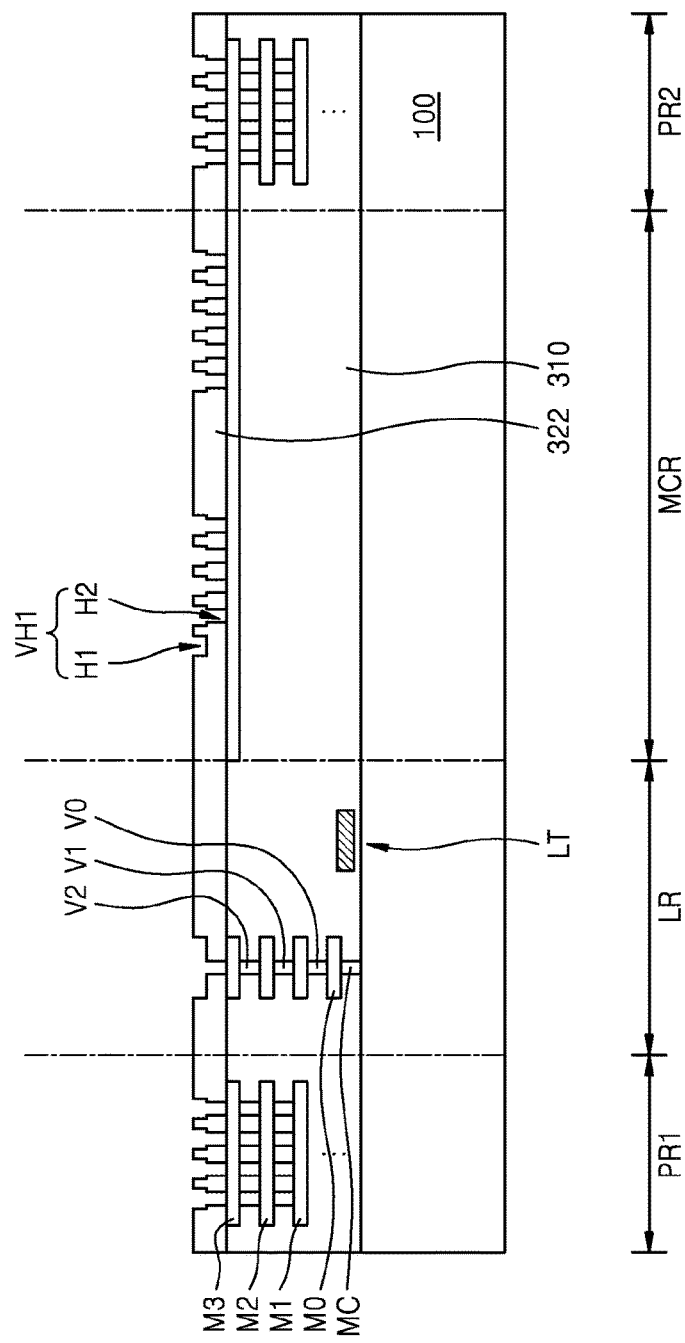

Referring to FIG. 12B, the first intermediate insulating layer 322 having a plurality of first via holes VH1 may be formed on a resultant of FIG. 12A. The first via hole VH1 may include at least one first hole H1 that does not expose the third wiring layer M3 and a plurality of second holes H2 that expose the third wiring layer M3 in a bottom surface thereof. In example embodiments, the first hole H1 may be omitted. The first via hole VH1 may be formed in the first intermediate insulating layer 322 for a dual damascene process and may have a lower space for the third via plug V3 of FIG. 2A and an upper space for the fourth wiring layer M4 of FIG. 2A. The first hole H1 of the first via hole VH1 may have only the upper space, and the second hole H2 of the first via hole VH1 may have the upper space and the lower space that are connected to each other.

Figure 12C:
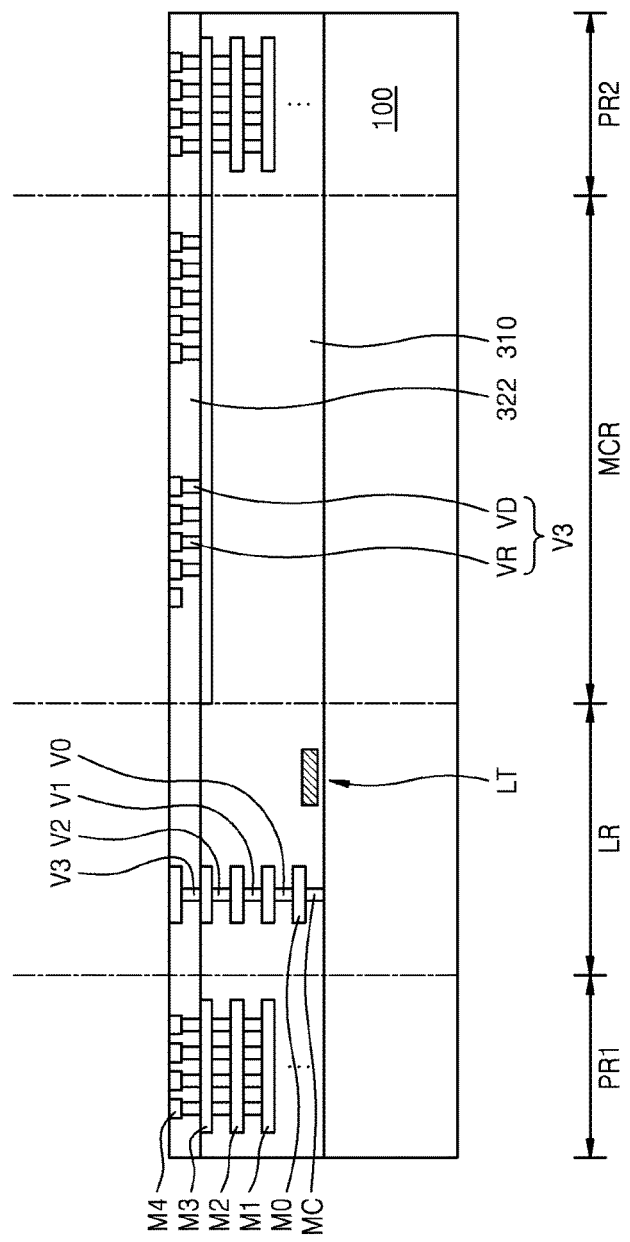

During a process of forming the third wiring layer M3, since the plurality of second via holes VH1, in particular, the plurality of second hole H2, are formed, during a process of forming the first via hole VH1, a charging effect that charges concentrate in a specific portion of the third wiring layer M3 (for example, a portion of the third wing layer M3 adjacent to the real via plug VR shown in FIG. 12C) may be reduced or prevented. Accordingly, a not-open defect that the third wiring layer M3 is not exposed through the second hole H2 may not occur.

Referring to FIG. 12C, the third via plug V3 and the fourth wiring layer M4 may be formed by filling the first via hole VH1 of FIG. 12B with a conductive material. To form the third via plug V3 and the fourth wiring layer M4, the first via hole VH1 may be filled and a conductive material layer covering the first intermediate insulating layer 322 may be formed, and then a planarization process such as a chemical mechanical polishing (CMP) process that exposes the first intermediate insulating layer 322 may be performed.

Some of the third via plugs V3 formed in the memory cell region MCR may be the real via plugs VR, and others may be the dummy via plugs VD. The number of the dummy via plugs VD may be several through several hundred times greater than the number of the real via plugs VR.

Figure 12D:
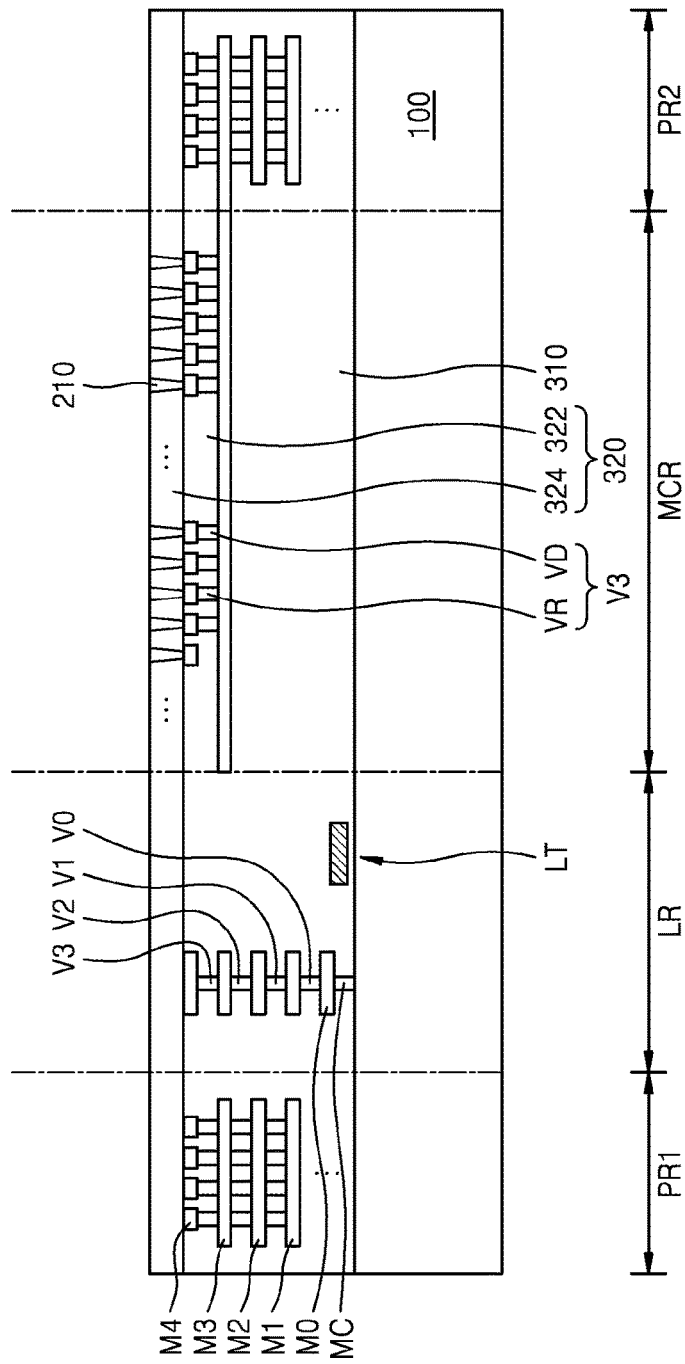

Referring to FIG. 12D, a second intermediate insulating layer 324 may be formed on a resultant of FIG. 12C and then the lower electrode 210 connected to the fourth wiring layer M4 may be formed in the second intermediate insulating layer 324. The lower electrode 210 may be formed by forming a hole exposing the fourth wiring layer M4 in the second intermediate insulating layer 324 and filling the hole with a conductive material.

Figure 12E:
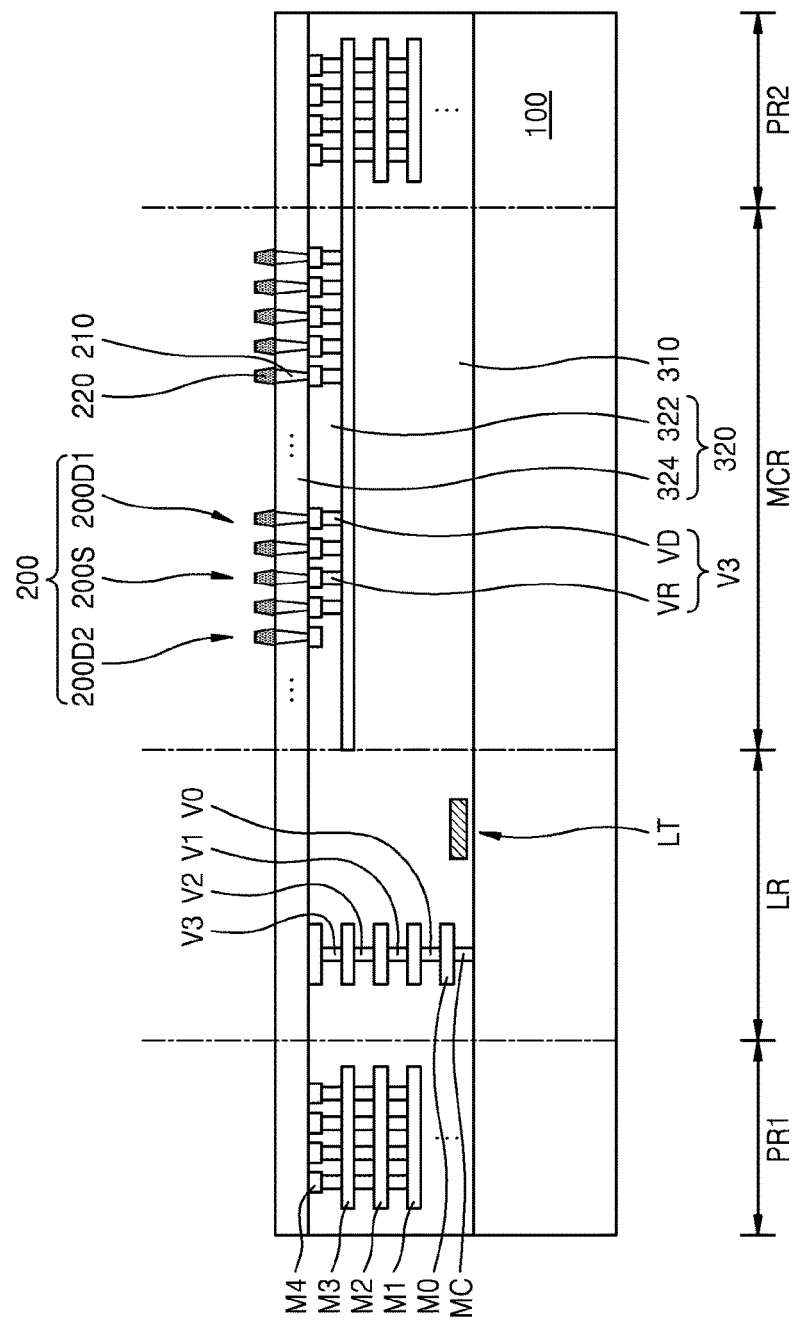

Referring to FIG. 12E, the resistance device 220 connected to the lower electrode 210 may be formed on a resultant of FIG. 12D and then the memory cell 200 including the lower electrode 210 and the resistance device 220 may be formed. In example embodiments, the resistance device 220 may be each of the magnetoresistance devices 400, 500, 600, 700, and 800 of FIGS. 7 through 11 but is not limited thereto.

The resistance device 220 may be formed by forming a resistance device material layer on the second intermediate insulating layer 324 and then performing a photolithography process and an etching process.

In example embodiments, a plasma etching process may be performed to form the resistance device 220. In example embodiments, a reactive ion etching (RIE) process, an ion beam etching (IBE) process, or an Ar milling process may be used as the etching process for forming the resistance device 220. In example embodiments, during the etching process for forming the resistance device 220, $SF_6$, $NF_3$, $SiF_4$, $CF_4$, $Cl_2$, $CH_3OH$, $CH_4$, $CO$, $NH_3$, $H_2$, $N_2$, HBr, or a first etching gas including a combination of these may be used. In example embodiments, during the etching process for forming the resistance device 220, in addition to the first etching gas, at least one first additional gas selected from Ne, Ar, Kr, and Xe may be further used.

The etching process for forming the resistance device 220 may be performed by using plasma formed from an inductively coupled plasma (ICP) source, a capacitively coupled plasma (CCP) source, an electron cyclotron resonance (ECR) plasma source, a helicon-wave excited plasma (HWEP) source, or an adaptively coupled plasma (ACP) source.

The etching process for forming the resistance device 220 may further include an etching process that uses a second etching gas having a different composition from that of the first etching gas. The second etching gas may include SF6, NF3, SiF4, CF4, Cl2, CH3OH, CH4, CO, NH3, H2, N2, HBr, or a combination of these. In example embodiments, during the etching process that uses the second etching gas, at least one second additional gas selected from Ne, Ar, Kr, and Xe may be further used.

The etching process for forming the resistance device 220 may be performed at a temperature from about −10 to about 65° C. and at a pressure from about 2 to about 5 mT.

The select memory cell 200S among the memory cells 200 may be connected to the real via plug VR. The first dummy via plug 200D1 may be connected to the dummy via plug VD. The second dummy via plug 200D2 may not be connected to the third via plug V3.

Figure 12F:
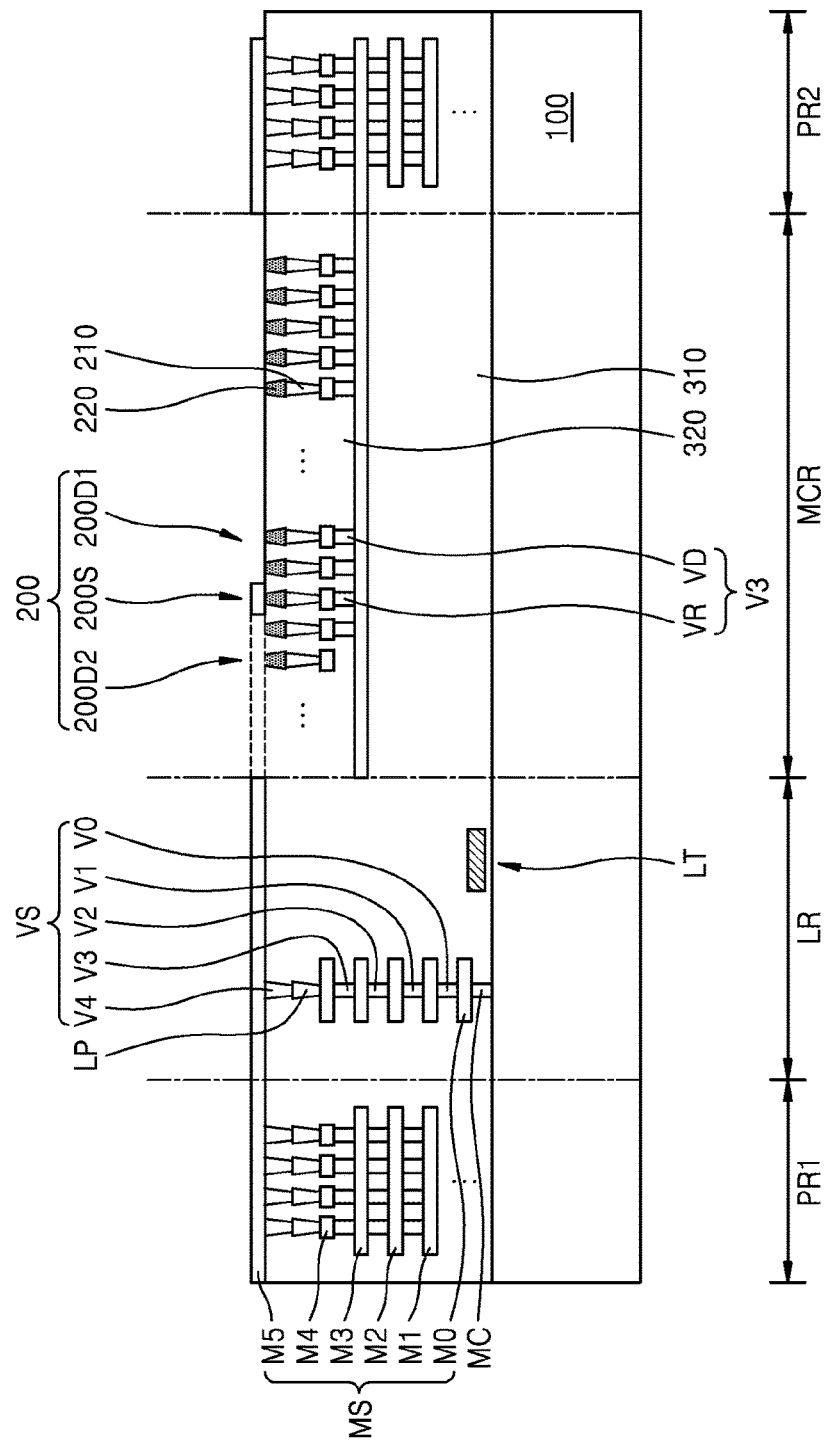

Referring to FIG. 12F, the first wiring layer M5 that is connected to the select memory cell 200S and is not connected to the dummy via plugs 200D1 and 200D2 in the memory cell region MCR may be formed on a resultant of FIG. 12D.

Before forming the fifth wiring layer M5, the landing plug LP and the fourth via plug V4 may be formed in the logic region LR and the pad regions PR1 and PR2. The fifth wiring layer M5 may be connected to the fourth via plug V4. Thereafter, as shown in FIG. 12A, the semiconductor device 1 may be completed by forming the upper insulating layer 330.

In example embodiments, when the fifth wiring layer M5 is formed through a damascene process, a part of the upper insulating layer 330 may be formed before forming the fifth wiring layer M5.

Referring to FIGS. 2A and 12A trough 12F, the semiconductor device 1 according to example embodiments may reduce or prevent a charging effect that charges concentrate on a portion of the third wring layer M3 adjacent to the real via plug VR by forming the dummy via plug VD when forming the real via plug VR that is the third via plug V3 for the select memory cell 200S, thereby reducing or preventing a not-open defect from occurring in the first via hole VH1 for the real via plug VR.

The semiconductor device 1 according to example embodiments may also reduce or prevent the charging effect that charges concentrate during a process of forming the fourth wiring layer M4 connected to the select memory cell 200S and the lower electrode 210 of the select memory cell 200S.

Therefore, reliability of an electrical connection between the select memory cell 200S and the third wiring layer M3 may be enhanced during a process of forming a relatively small number of the select memory cells 200S.

Since upper ends of the dummy memory cells 200D1 and 200D2, i.e. upper surfaces, are covered by the upper insulating layer 330, the dummy memory cells 200D1 and 200D2 may not be connected to the fifth wiring layer M5. Thus, the dummy memory cells 200D1 and 200D2 may not function as memory cells, and may not affect operations of the select memory cells 200S adjacent to the dummy memory cells 200D1 and 200D2.

The semiconductor device 1a of FIG. 3A may be manufactured if the upper electrode 230 is formed before the fifth wiring layer M5 is formed, and thus a detailed description of a manufacturing method thereof is omitted.

The semiconductor device 1b of FIG. 4A may be manufactured if the lower electrode 210 is formed by using a method of forming the third via plug V3, and the memory cell 200 is disposed between the fourth wiring layer M4 and the fifth wiring layer M5, and thus a detailed description of a manufacturing method thereof is omitted.

Figure 13A:
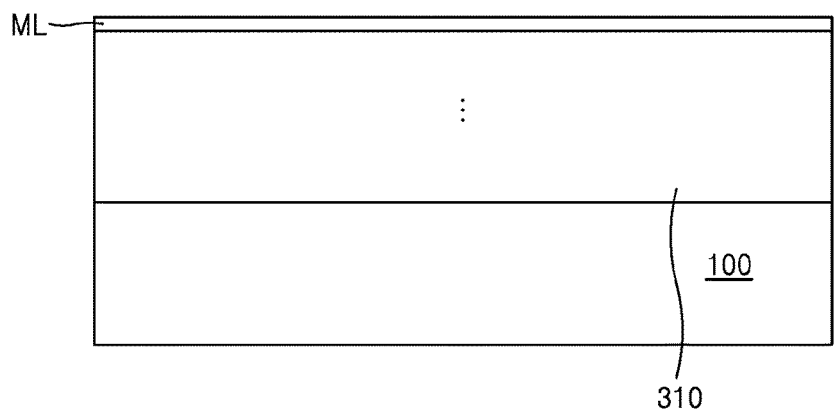
FIGS. 13A and 13B are cross-sectional views for sequentially describing a method of manufacturing a semiconductor device according to example embodiments.
Figure 13B:
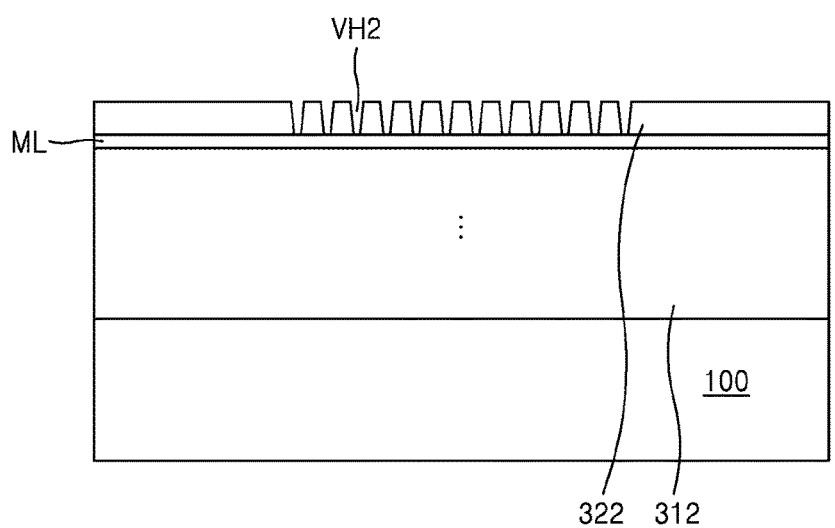

FIGS. 13A and 13B are cross-sectional views for sequentially describing a method of manufacturing a semiconductor device according to example embodiments. More specifically, FIGS. 13A and 13B are cross-sectional views for describing a method of manufacturing the semiconductor device 2 of FIG. 5A.

Referring to FIG. 13A, the lower insulating layer 312 and the lower wiring layer ML may be formed on the substrate 100.

Referring to FIG. 13B, the intermediate insulating layer 322 including the plurality of second via hole VH2 may be formed on the lower wiring layer ML. The second via hole VH2 may expose the lower wiring layer ML in a bottom surface thereof.

Thereafter, as shown in FIGS. 5A and 5B, the semiconductor device 2 may be manufactured by forming the via plug VP filling the second via hole VH2, forming the upper wiring layer MH that is connected to the real via plug VPR that is one of the via plugs VP and is not connected to the dummy via plug VPD that is another one of the via plugs VP, and forming the upper insulating layer 332 covering an upper surface of the dummy via plug VPD and the upper wiring layer MH.

Figure 14:
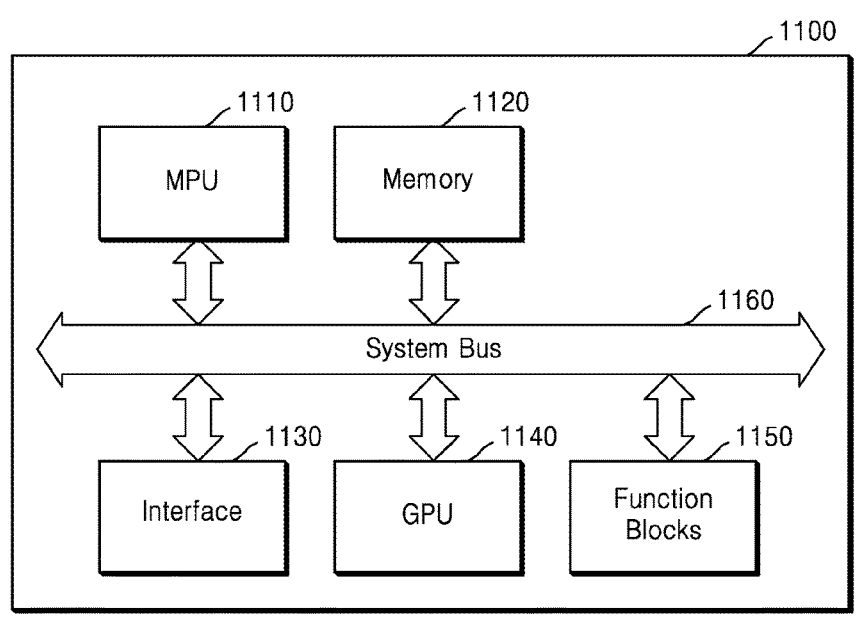
FIG. 14 is a block diagram of a semiconductor device according to example embodiments.

FIG. 14 is a block diagram of a semiconductor device 1100 according to example embodiments.

Referring to FIG. 14, the semiconductor device 1100 may include a main processing unit (MPU) 1110, a memory 1120, an interface 1130, a GPU 1140, functional blocks 1150, and a bus 1160 via which the main processing unit (MPU) 1110, the memory 1120, the interface 1130, the GPU 1140, and the functional blocks 1150 are connected to one another. The semiconductor device 1100 may include both the MPU 1110 and the GPU 1140 or may include either the MPU 1110 or the GPU 1140.

The MPU 1110 may include a core and an L2 cache. For example, the MPU 1110 may include multi-cores. Performances of the multi-cores may be the same as or different from each other. The multi-cores may be activated at the same time or at different points of time. The memory 1120 may store results of processes performed in the function blocks 1150, under the control of the MPU 1110. For example, as the contents stored in the L2 cache of the MPU 1110 is flushed, the memory 1120 may store the results of processes that are performed in the function blocks 1150. The interface 1130 may interface with external devices. For example, the interface 1130 may interface with a camera, a liquid crystal display (LCD), a speaker, etc.

The GPU 1140 may perform graphic functions. For example, the GPU 1140 may perform video codec or process three-dimensional (3D) graphics.

The function blocks 1150 may perform various functions. For example, when the semiconductor device 1100 is an AP for use in a mobile device, some of the function blocks 1150 may perform a communication function.

The semiconductor device 1100 may be each of the semiconductor devices 1, 1a, 1b, 2, and 10 of FIGS. 1 through 5B. The memory 1120 may be a memory cell array formed in each of the memory cell regions MAR1, MAR2, MAR3, and MAR4 of FIG. 1.

The MPU 1110, the interface 1130, the GPU 1140, the functional blocks 1150, and the bus 1160 may be the logic regions LR, LR1, LR2, LR3, and LR4 of FIGS. 1 through 5B or the semiconductor device 2 of FIGS. 5A and 5B.

At least one of the MPU 1110, the interface 1130, the GPU 1140, the functional blocks 1150, and the bus 1160 may include the memory cell regions MCR, MCRa, and MCRb having the select memory cell 200S of FIGS. 1 through 4B.

The semiconductor device 1100 including the select memory cell 200S of FIGS. 2A through 4B may have a high reliability.

A semiconductor device including via plugs according to the inventive concepts may reduce or minimize a charging effect that charges concentrate, and thus a not-open defect of via holes for forming via plugs may be reduced or prevented. Accordingly, reliability of an electrical connection through via plugs may be enhanced.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
a substrate including a memory cell region and a pad region;
a lower insulating layer on the substrate;
a lower wiring layer extending on the lower insulating layer, a lower surface of the lower wiring layer being covered by the lower insulating layer in the memory cell region;
a plurality of via plugs connected to and extending in a first direction on the lower wiring layer, the plurality of via plugs including a real via plug and a first dummy via plug;
a plurality of memory cells on the lower wiring layer, each of the plurality of via plugs between each of the plurality of memory cells and the lower wiring layer, and the plurality of memory cells including a selected memory cell connected to the real via plug and a first dummy memory cell connected to the first dummy via plug;
an upper wiring layer connected to an upper surface of the selected memory cell and not connected to the first dummy memory cell; and
an upper insulating layer covering the upper wiring layer and an upper surface of the first dummy memory cell.

2. The semiconductor device of claim 1, wherein the upper wiring layer on the selected memory cell extending in a second direction on the selected memory cell, the second direction different from the first direction.

3. The semiconductor device of claim 2, wherein
the upper wiring layer includes a first portion, a second portion and a bending portion,
the first portion extends in the second direction,
the second portion extends in the first direction, and
the bending portion is between the first portion and the second portion.

4. The semiconductor device of claim 1, further comprising:
a plurality of intermediate wiring layers between the plurality of via plugs and the plurality of memory cells, at least some of the plurality of intermediate wiring layers being connected to the plurality of via plugs.

5. The semiconductor device of claim 4, wherein
at least one of the plurality of intermediate wiring layers is not connected to the plurality of via plugs, and
the plurality of memory cells further comprise a second dummy memory cell on the at least one of the plurality of intermediate wiring layers that is not connected to the plurality of via plugs.

6. The semiconductor device of claim 4, wherein at least one of the plurality of via plugs and at least one of the plurality of intermediate wiring layers that are connected to each other are integrally formed.

7. The semiconductor device of claim 1, wherein each of the plurality of memory cells comprises a lower electrode and a resistance device on the lower electrode.

8. The semiconductor device of claim 7, wherein the selected memory cell further comprises an upper electrode between the resistance device and the upper wiring layer.

9. The semiconductor device of claim 1, wherein
the first dummy via plug is a plurality of dummy via plugs,
and
a number of the plurality of dummy via plugs is greater than a number of the real via plug.

10. The semiconductor device of claim 1, wherein the plurality of via plugs connected to the lower wiring layer are coupled to one another in the pad region to connect the lower wiring layer and the upper wiring layer in the pad region.

11. The semiconductor device of claim 10, wherein the plurality of via plugs in the memory cell region and the plurality of via plugs in the pad region have a same horizontal unit area.

12. A semiconductor device, comprising:
a lower insulating layer on a substrate;
a lower wiring layer extending on the lower insulating layer, a lower surface of at least a part of the lower wiring layer being covered by the lower insulating layer;
a plurality of via plugs extending in a first direction on the lower wiring layer, the plurality of via plugs including a real via plug and a first dummy via plug connected to the part of the lower wiring layer covered by the lower insulating layer; and
an upper wiring layer overlapping the lower wiring layer and extending in a second direction different from the first direction on the real via plug, the upper wiring layer not overlapping the dummy via plug;
an upper insulating layer covering an upper surface of the dummy via plug and the upper wiring layer;
a selected memory cell between the upper wiring layer and the real via plug; and
a dummy memory cell on the dummy via plug.

13. The semiconductor device of claim 12, further comprising:
an upper insulating layer covering an upper surface of the dummy memory cell and the upper wiring layer.

14. A semiconductor device, comprising:
a lower insulating layer on a substrate;
a lower wiring layer extending on the lower insulating layer, a lower surface of a portion of the lower wiring layer being covered by the lower insulating layer;
a plurality of via plugs extending in a first direction on the lower wiring layer, the plurality of via plugs including a real via plug and a plurality of dummy via plugs connected to a part of the lower wiring layer covered by the lower insulating layer, a number of the plurality of dummy via plugs being greater than a number of the real via plug; and
an upper wiring layer overlapping the lower wiring layer;
wherein the upper wiring layer includes a first portion, a second portion and a bending portion,
the first portion extends in a second direction different from the first direction,
the second portion extends in the first direction, and
the bending portion is between the first portion and the second portion;
wherein the upper wiring layer does not overlap at least one of the plurality of dummy via plugs;

a selected memory cell between the upper wiring layer and the real via plug; and a dummy memory cell on the at least one of the plurality of dummy via plugs.

15. The semiconductor device of claim 14, further comprising:

an upper insulating layer covering an upper surface of the dummy memory cell and the upper wiring layer.

* * * * *